(12) United States Patent
Takizawa et al.

(10) Patent No.: US 6,406,946 B1
(45) Date of Patent: *Jun. 18, 2002

(54) THIN FILM TRANSISTOR MATRIX DEVICE AND METHOD FOR FABRICATING THE SAME

(75) Inventors: Hidaki Takizawa; Shougo Hayashi; Takeshi Kinjo; Makoto Tachibanaki; Kenji Okamoto, all of Kawasaki (JP)

(73) Assignee: Fujitsu Limited, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/005,176

(22) Filed: Jan. 8, 1998

Related U.S. Application Data

(62) Division of application No. 08/669,272, filed on May 29, 1996, now Pat. No. 5,742,074.

(30) Foreign Application Priority Data

May 31, 1995 (JP) .............................................. 7-134400

(51) Int. Cl.[7] .......................... H01L 21/00; H01L 21/84
(52) U.S. Cl. ........................... 438/149; 438/30; 257/59; 257/72; 349/149; 349/150; 349/151; 349/152
(58) Field of Search ..................... 438/30, 149; 257/59, 257/72; 349/149–152

(56) References Cited

U.S. PATENT DOCUMENTS

| | | | |
|---|---|---|---|
| 4,789,889 A | 12/1988 | Morris et al. | 357/68 |
| 5,247,375 A | 9/1993 | Mochizuki et al. | 359/54 |
| 5,250,931 A | 10/1993 | Misawa et al. | 345/206 |
| 5,341,012 A | * 8/1994 | Misawa et al. | |
| 5,467,210 A | 11/1995 | Kishigami | 359/88 |
| 5,483,082 A | 1/1996 | Takizawa et al. | 257/59 |
| 5,576,868 A | * 11/1996 | Togashi | |
| 5,668,032 A | * 9/1997 | Homberg et al. | |

FOREIGN PATENT DOCUMENTS

| | | |
|---|---|---|
| JP | 2254421 | 10/1990 |
| JP | 5216062 | 8/1993 |
| JP | 6202151 | 7/1994 |
| JP | 6202153 | 7/1994 |

* cited by examiner

*Primary Examiner*—Long Pham
*Assistant Examiner*—Scott Brairton
(74) *Attorney, Agent, or Firm*—Greer, Burns & Crain, Ltd.

(57) ABSTRACT

A TFT matrix-type liquid crystal display device is used in laptop personal computers and wall TV's. On a transparent insulating substrate there are formed gate bus lines for commonly connecting the gates of thin film transistors, drain bus lines for commonly connecting the drains of the thin film transistors, and outside terminals and outside terminals opposed respectively to the ends of the gate bus lines and the drain bus lines, opposed respectively to the ends of the gate bus lines and the drain bus lines. Gate connection lines for commonly connecting the gate bus lines and drain connection lines for commonly connecting the drain bus lines are formed on the transparent insulating substrate in regions inner of the outside terminals. The thin film transistor matrix device can be fabricated without occurrence of short circuit defects, with little characteristic change and with high yields.

4 Claims, 29 Drawing Sheets

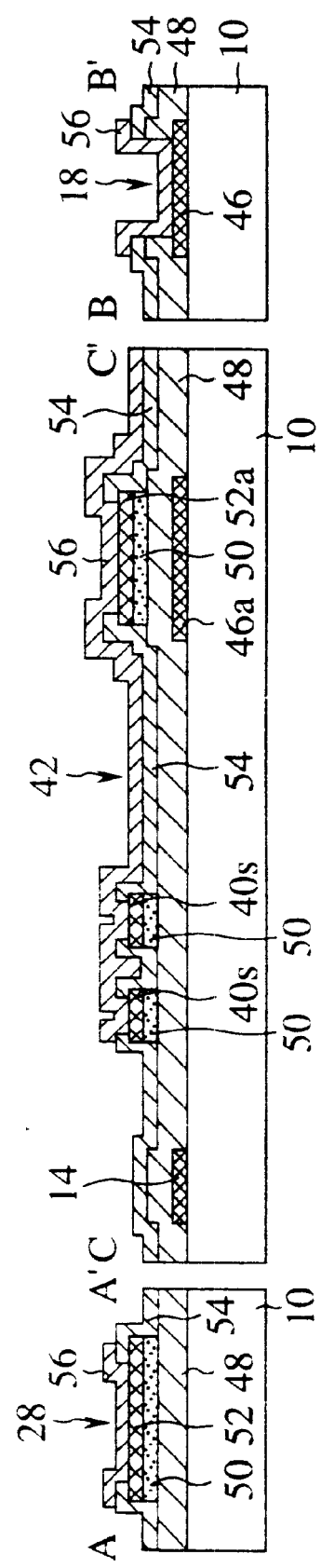

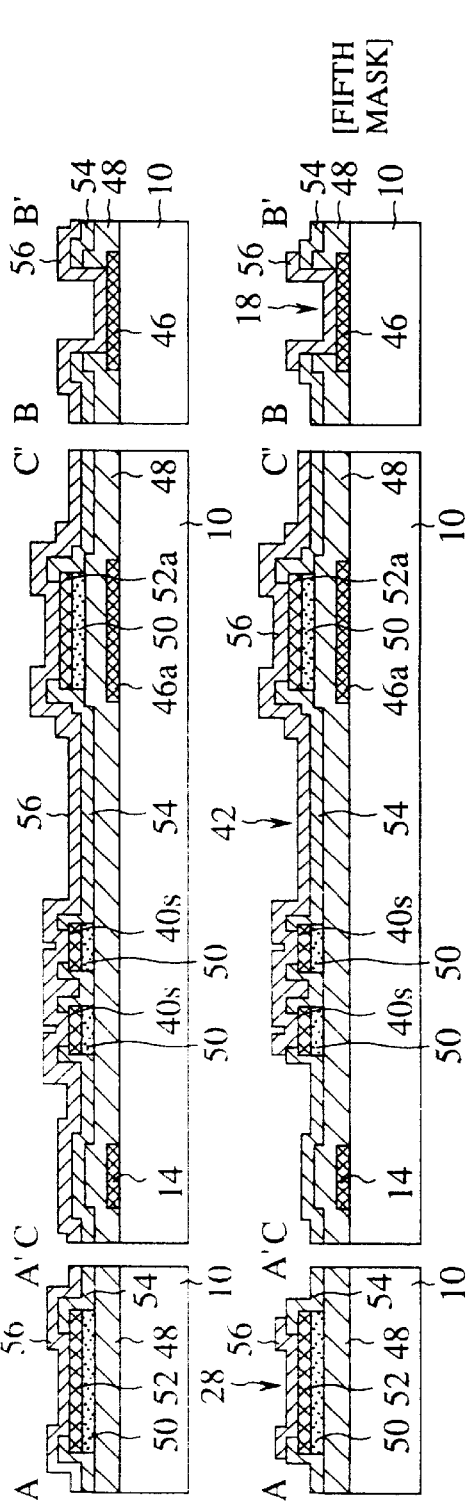

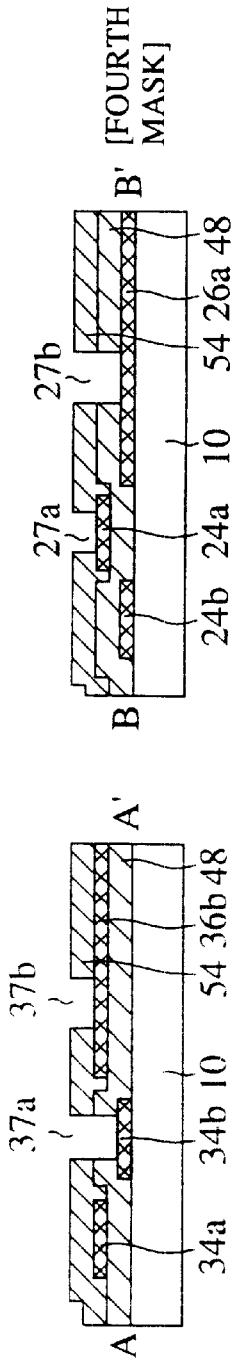
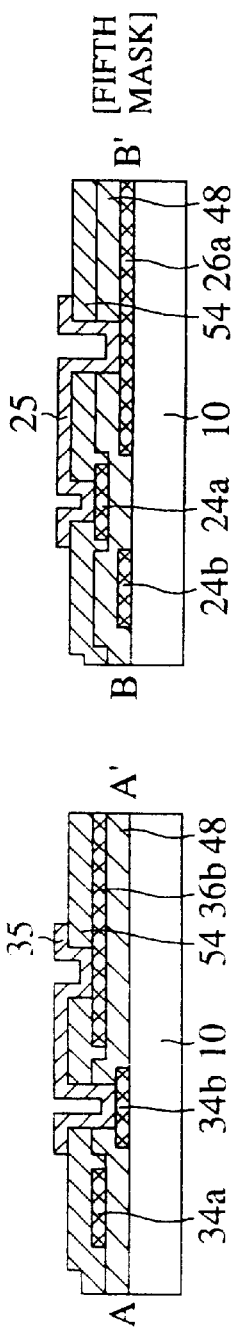
FIG.28A
FIG.28B
FIG.28C
FIG.28D

THIN FILM TRANSISTOR MATRIX DEVICE AND METHOD FOR FABRICATING THE SAME

This is a divisional, of application Ser. No.: 08/669,272, filed May 29, 1996 now U.S. Pat. No. 5,742,074.

BACKGROUND OF THE INVENTION

The present invention relates to a thin film transistor matrix device and a method for fabricating the same, more specifically a TFT-LCD (TFT matrix-type liquid crystal display device) for use in laptop personal computers and wall TVs, and a method for fabricating the same.

TFT-LCDs have characteristics of thinness and lightness, low electric power consumption, etc. and are expected to have a large market in the future as a display device which will take place of CRTs. To realize TFT panels of high precision, large screens for use in work stations, etc., the aperture ratio is a significant problem for higher image quality. To fabricate inexpensive TFT panels, it is important that the TFT panels have device structures which can be fabricated by the use of photolithography techniques.

A pattern layout of a conventional thin film transistor matrix device is shown in FIG. 35.

An image display region 112 is disposed at the center of a transparent insulating substrate 110, and a plurality of thin film transistors (not shown) and a plurality of picture element electrodes (not shown) connected to the sources of the respective thin film transistors are arranged in a matrix in the region. The gate electrodes of the thin film transistors are commonly connected to gate bus lines 114a and 114b arranged widthwise as viewed in FIG. 35, and the drain electrodes thereof are commonly connected to drain bus lines 116a and 116b arranged lengthwise as viewed in FIG. 35.

The plural gate bus lines 114a and 114b are separated in odd number-th gate bus lines 114a which are adjacent to each other, and even number-th gate bus lines 114b (in this specification, the term "odd number-th lines" is used to refer to the odd numbered lines, namely the first, third, fifth, . . . lines; the term "even number-th lines" is used to refer to the even numbered lines, namely the second, fourth, sixth, . . . lines ). The odd number-th gate bus lines 114a are connected to gate side tab terminals 118a on the right side as viewed in FIG. 35, and the even number-th gate bus lines 114b are connected to gate side tab terminals 118b on the left side as viewed in FIG. 35.

The plural drain bus lines 116 are separated in odd number-th drain bus lines 116a which are adjacent to each other, and even number-th drain bus lines 116b. The odd number-th drain bus lines 116a are connected to drain side tab terminals 120a on the upper side as viewed in FIG. 35, and the even number-th drain bus lines 116b are connected to drain side tab terminals 120b on the lower side as viewed in FIG. 35.

In the thus-structured thin film transistor matrix device, as described above, the gate bus lines 114a, 114b, and the drain bus lines 116a, 116b are respectively formed by independent conducting layer patterns. As a result problems due to electric stresses, such as electrostatic charges, etc., occur in the process for fabricating the thin film transistor and in the process for fabricating the liquid crystal panel, whereby the conducting layer patterns are short-circuited and the characteristics of the thin film transistors, such as threshold values, etc., are changed.

SUMMARY OF THE INVENTION

An object of the present invention is to provide a thin film transistor matrix device and a method for fabricating the same, which is free from occurrence of short-circuit and characteristic changes due to stresses, such as electrostatic charges, etc. and which can be fabricated with high yields.

Another object of the present invention is to provide a thin film transistor matrix device and a method for fabricating the same, which can be inspected with high precision, so that possible defective products can be rejected beforehand.

The above-described objects are achieved by a thin film transistor matrix device comprising: transparent insulating substrate; a plurality of thin film transistors arranged on the transparent insulating substrate in a matrix; a plurality of picture element electrodes arranged on the transparent insulating substrate in a matrix and connected to the sources of the thin film transistors; a plurality of bus lines for commonly connecting the gates or the drains of the thin film transistors; outside terminals formed on a margin of the transparent insulating substrate and opposed to the ends of the bus lines; and connection lines formed in regions inner of the outside terminals and commonly connecting said plurality of bus lines, whereby even when electric stresses due to electrostatic charges are applied in the process for fabricating the thin film transistor matrix device, the device can be fabricated without short-circuit defects and with little characteristic change and high yields.

In the above-described thin film transistor matrix device it is preferable that the connection lines include a plurality of connection lines, said plurality of gate bus lines which are adjacent to each other being respectively commonly connected to said plurality of connection lines, whereby inspection of high precision is possible by applying different voltages to the connection lines, so that defective products can be expelled beforehand.

It is preferable that the above-described thin film transistor matrix device further comprises resistant lines which interconnect said plurality of connection lines and have a higher resistant value than the connection lines.

The above-described objects are achieved by a transparent insulating substrate; a plurality of thin film transistors arranged on the transparent insulating substrate in a matrix; a plurality of picture element electrodes arranged on the transparent insulating substrate in a matrix and connected to the sources of the thin film transistors; a plurality of gate bus lines for commonly connecting the gates of the thin film transistors; a plurality of drain bus lines for commonly connecting the drains of the thin film transistors; first outside terminals formed on a margin of the transparent insulating substrate and opposed to the ends of the gate bus lines; second outside terminals formed on a margin of the transparent insulating substrate and opposed to the ends of the drain bus lines; and gate connection lines formed in an inner region of the second outside terminals and commonly connecting said plurality of drain bus lines, whereby even when electric stresses due to electrostatic charges are applied in the process for fabricating the thin film transistor matrix device, the device can be fabricated without short-circuit defects and with little characteristic change and high yields.

In the above-described thin film transistor matrix device it is preferable that the thin film transistor matrix device further comprises resistant lines for interconnecting the gate connection lines and the drain connection lines, and having a higher resistant value than the gate connection lines and the drain connection lines.

In the above-described thin film transistor matrix device it is preferable that a first gate connection line and a second gate connection line respectively commonly connect said plurality of gate bus lines which are adjacent to each other, and a first drain connection line and a second drain connection line respectively commonly connect said a plurality of gate drain lines which are adjacent to each other.

In the above-described thin film transistor matrix device it is preferable that the thin film transistor matrix device further comprises resistant lines for interconnecting the first and the second gate connection lines, and the first and the second drain connection lines and having a resistant value than said plurality of connection lines, whereby inspection of high precision is possible by applying different voltages to the connection lines, so that defective products can be rejected beforehand The above-described objects are achieved by the method for fabricating a thin film transistor matrix device comprising: a first step of forming on a transparent insulating substrate a plurality of gate bus lines for commonly connecting the gates of thin film transistors, first outside terminals opposed to ends of the gate bus lines, and a gate connection line formed in a region inner of the first outside terminals for commonly connecting said plurality of gate bus lines; a second step of forming a first insulating film on the entire surface; and a third step of forming on the first insulating film a plurality of drain bus lines for commonly connecting the drains of the thin film transistors, second outside terminals opposed to the ends of the drain bus lines, and a drain connection line formed in a region inner of the second outside terminals for commonly connecting said plurality of drain bus lines.

The above-described objects are achieved by the method for fabricating a thin film transistor matrix device comprising: a first step of forming on a transparent insulating substrate a plurality of gate bus lines for commonly connecting the gates of thin film transistors, first outside terminals opposed to the ends of the gate bus lines, and a first gate connection line for commonly connecting the gate bus lines of one of groups in which adjacent ones of said plurality of gate bus lines are divided; a second step of forming a first insulating film on the entire surface; a third step of forming on the first insulating film a plurality of drain bus lines for commonly connecting the drains of the thin film transistors, second outside terminals opposed to the ends of the drain bus lines, and a first drain connection line for commonly connecting the drain bus lines of one of groups in which adjacent ones of said plurality of drain bus lines are divided; a fourth step of forming a second insulating film on the entire surface; and a fifth step of forming on the second insulating film picture element electrodes, a second gate connection line for commonly connecting the gate bus lines of the other of the groups in which adjacent ones of said plurality of gate bus lines are divided, and a second drain connection line for commonly connecting the drain bus lines of the other of the groups in which adjacent ones of said plurality of drain bus lines are divided.

The above-described objects are achieved by the method for fabricating a thin film transistor matrix device comprising: a first step of forming on a transparent insulating substrate a plurality of gate bus lines for commonly connecting the,gates of thin film transistors, first outside terminals opposed to the ends of the gate bus lines, a fist gate connection line for commonly connecting the gate bus lines of one of groups in which adjacent ones of said plurality of gate bus lines are divided, and a first drain connection line for commonly connecting the drain bus lines of one of groups in which adjacent ones of said plurality of drain bus lines are divided; a second step of forming a first insulating film on the entire surface; and a third step forming on the first insulating film said plurality of drain bus lines for commonly connecting the drains of the thin film transistors, second outside terminals opposed to the ends of the drain bus lines; a second drain connection line for commonly connecting the drain bus lines of the other of the groups in which adjacent ones of said plurality of drain bus lines are divided, and a second gate connection line for commonly connecting the gate bus lines of the other of the groups in which adjacent ones of said plurality of gate bus lines are divided.

The above-described objects are achieved by the method for fabricating a thin film transistor matrix device comprising: a first step of forming on a transparent insulating substrate a plurality of gate bus lines for commonly connecting the gates of thin film transistors, first outside terminals opposed to the ends of the gate bus lines, a first gate connection line for commonly connecting the gate bus lines of one of groups in which adjacent ones of said plurality of gate bus lines are divided, and a first drain connection line for commonly connecting the drain bus lines of one of groups in which adjacent ones of said plurality of drain bus lines are divided; a second step of forming a first insulating film on the entire surface; a third step of forming on the first insulating film said plurality of drain bus lines for commonly connecting the drains of the thin film transistors, second outside terminals opposed to the ends of the drain bus lines, a second drain connection line, and a second gate connection line; a fourth step of forming a second insulating film on the entire surface; and a fifth step of forming on the second insulating film picture element electrodes, a first connection line for connecting the drain bus lines of the other of the groups in which adjacent ones of said plurality of drain lines are divided to the second drain connection line, and a second connection line for connecting the gate bus lines of the other of the groups in which adjacent ones of said plurality of gate bus lines are divided to the second gate connection line.

In the above-described method for fabricating a thin film transistor matrix device, it is preferable that the method further comprises a fourth step of forming a second insulating film on the entire surface after the third step; and a fifth step of forming on the second insulating film picture element electrodes, and a resistant line for interconnecting the gate connection lines and the drain connection lines.

In the above-described method for fabricating a thin film transistor matrix device, it is preferable that in the fifth step resistant lines for interconnecting the first and the second gate connection lines and the first and the second drain connection lines are formed.

In the above-described method for fabricating a thin film transistor matrix device, it is preferable that after the fabrication steps are over, the gate bus lines are electrically disconnected from the gate connection lines, and the drain bus lines are electrically disconnected from the drain connection lines.

BRIEF DESCRIPTION OF THE DRAWINGS

FIG. 4 is a sectional view of the thin film transistor matrix device of FIGS. 2 and 3.

FIGS. 6A to 6D are sectional views of the thin film transistor matrix device according to the first embodiment of the present invention at the respective steps of a method for fabricating the same (Part 2).

FIGS. 19A to 19C are sectional views of the thin film transistor matrix device according to the third embodiment of the present invention at the respective steps of the second method for fabricating the same (Part 2).

FIGS. 28A to 28D are sectional views of the thin film transistor matrix device according to the fourth embodiment of the present invention at the respective steps of the first method for fabricating the same (Part 2).

DETAILED DESCRIPTION OF THE INVENTION

1. A First Embodiment 1.1 Thin film Transistor Matrix Device

The thin film transistor matrix device according to a first embodiment of the present invention will be explained with reference to FIGS. 1 to 6.

Figure 1:
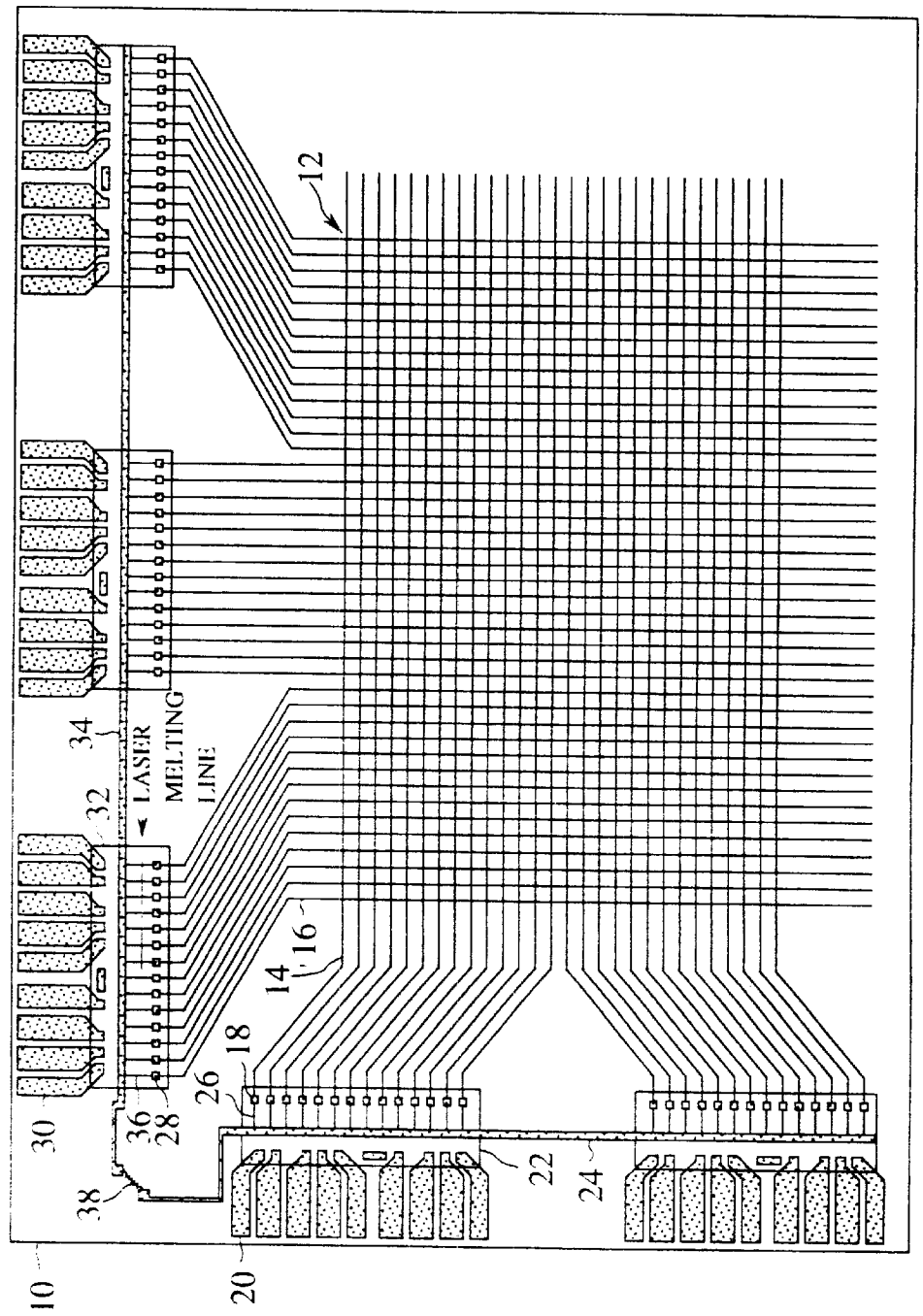
FIG. 1 is a plan view of the thin film transistor matrix device according to a first embodiment of the present invention.
Figure 2:
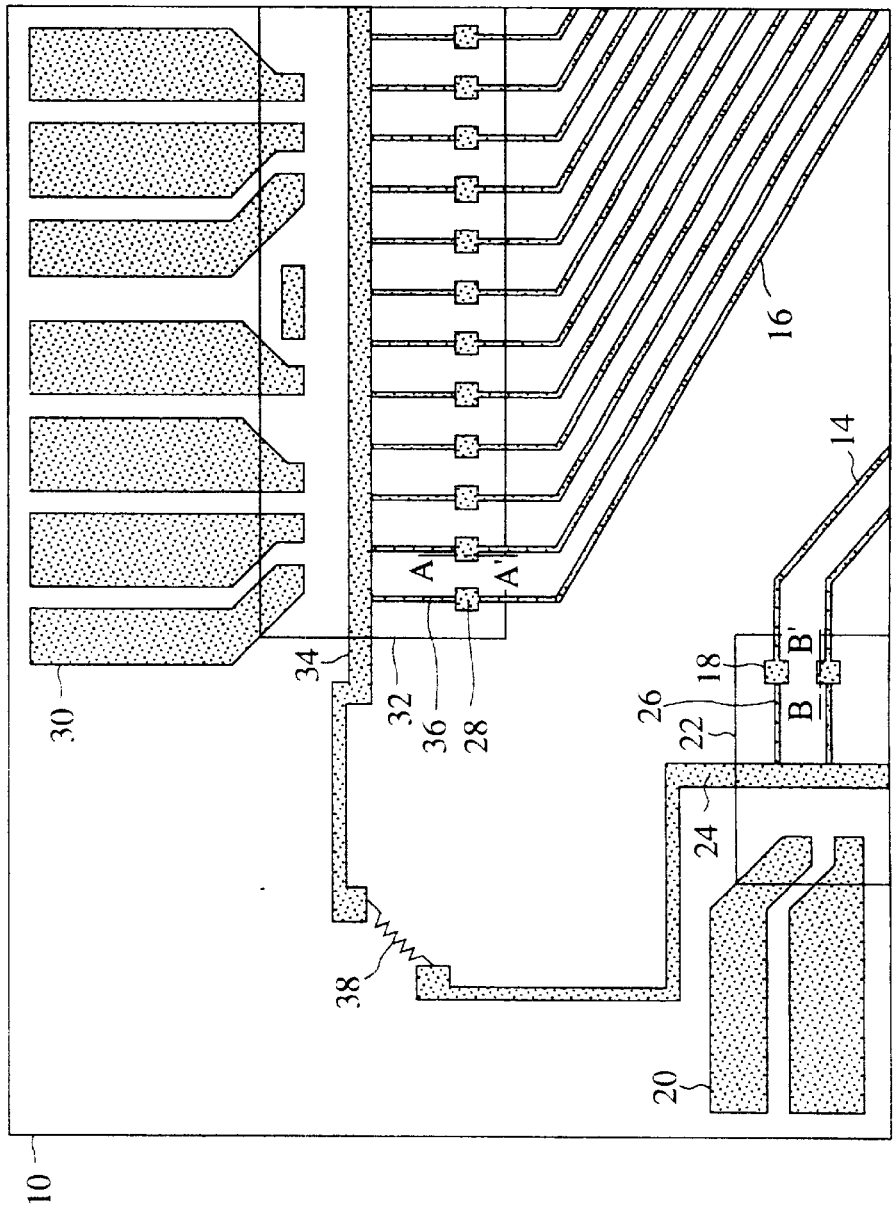
FIG. 2 is an enlarged plan view of the thin film transistor matrix device of FIG. 1.
Figure 3:
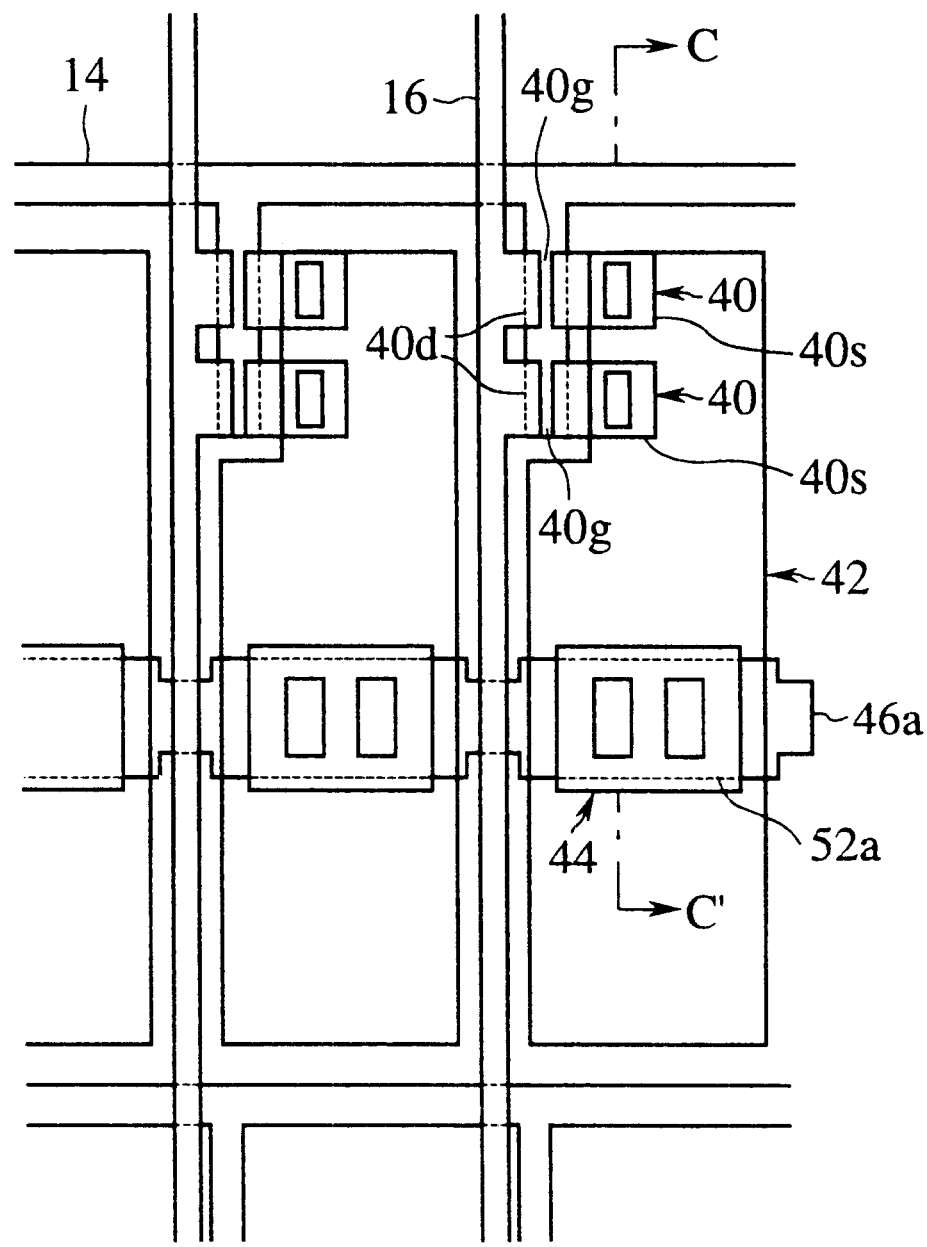
FIG. 3 is an enlarged plan view of an image display region of the thin film transistor matrix device of FIG. 1.

FIG. 1 shows a pattern layout of the thin film transistor matrix device according to the present embodiment. FIG. 2 is an enlarged view of a wiring region of the thin film transistor matrix device. FIG. 3 is an enlarged view of an image display region of the thin film transistor matrix device of FIG. 1. FIG. 4 is a sectional view of the thin film transistor matrix device of FIG. 1.

First, with reference to FIG. 1, the general layout of the thin film transistor matrix device according to the present embodiment will be explained.

In the thin film transistor matrix device according to the present embodiment, a gate drive circuit and a drain drive circuit are mounted only on one side of a transparent insulating substrate 10.

An image display region 12 is provided at the center of the transparent insulating substrate 10, and a plurality of thin film transistors (not shown) and a plurality of image electrodes (not shown) connected to the sources of the thin film transistors are arranged in a matrix in the region 12. The gate electrodes of the plural thin film transistors are commonly connected to the gate bus lines 14 which are arranged widthwise as viewed in FIG. 1, and the drain electrodes of the plural thin film transistors are commonly connected to drain bus lines 16 which are arranged lengthwise as viewed in FIG. 1.

The gate bus lines 14 are extended to the left as viewed in FIG. 1 and have bumps 18 formed on the ends thereof. On a margin of the transparent insulating substrate 10 there are formed input terminals 20 which receives signals from the outside. The inner ends of the input terminals 20 and the bumps 18 of the gate bus lines 14 are opposed to each other in IC chip regions 22 where driver IC chips (not shown) are disposed.

A gate connection line 24 which commonly connects with the gate bus lines 14 is longitudinally in the IC chip region 22 between the input terminals 20 and the bumps 18. The gate connection line 24 and the bumps 18 of the gate bus lines 14 are connected with each other by thin connection lines 26. The thin connection lines 26 are finally melted off by laser beams to electrically disconnect the gate bus lines 14 from the gate connection line 24.

The drain bus lines 16 are extended upward as viewed in FIG. 1, and bumps 28 are formed on the ends of the drain bus lines 16. Input terminals 30 which receive signals from the outside are formed on a margin of the transparent insulating substrate 10. The inner ends of the input terminals 30 and the bumps 28 of the drain bus lines 16 are opposed to each other in an IC chip region 32 where driver IC chips (not shown) are mounted.

A drain connection line 34 which commonly connects the drain bus lines is extended widthwise as viewed in FIG. 1 in the IC chip region 32 between the input terminals 30 and the bumps 28. Thin connection lines 36 interconnect the drain connection line 34 and the bumps 28 of the drain bus lines 16. The thin connection lines 36 are finally melted off by laser beams to electrically disconnect the drain bus lines 14 from the drain connection line 34.

The gate connection line 24 and the drain connection line 34 are connected with each other by a resistant wire 38 having a higher resistance value than the gate connection line 24 and the drain connection line 34.

Next, the thin film transistor matrix device according to the present embodiment will be detailed with reference to FIGS. 2 to 4. In FIG. 4, the drawing on the left is a sectional view of the bumps 28 of the drain bus lines 16 along the line A–A' in FIG. 2, the drawing on the right is a sectional view of the bumps 18 of the gate bus lines 14 along the line B–B' in FIG. 2, and the drawing at the center is a sectional view of the thin film transistors and the picture element electrodes along the line C–C' in FIG. 3.

The image display unit 12 of the thin film transistor matrix device will be detailed with reference to the plan view of the image display region of FIG. 3 and the line C–C' sectional view in FIG. 4.

FIG. 3 shows a plane structure of the image display unit 12. The thin film transistors 40 are disposed at the intersections between the gate bus lines 14 and the drain bus lines 16. The thin film transistors 40 have the gate electrodes 40g connected to the gate bus lines 14, the drain electrodes 40d connected to the drain bus lines 16 and the source electrodes 40s connected to the picture element electrodes 42. Capacitors 44 are disposed at the centers of the picture element electrodes 42.

A sectional structure of the image display unit 12 is shown by the C–C' sectional view in FIG. 4. On the transparent insulating substrate 10 there are formed the gate bus lines 14 of a metal layer 46 of, e.g., Al or Cr, and capacitor electrodes 46a of the capacitors 44. The gate bus lines 14 and the capacitor electrodes 46a share the same layer with the gate electrodes 40g.

On the metal layer 46 there is formed a first insulating film 48 of an SiN film, a two-layer film of an $SiO_2$ film and an SiN film, or others. The first insulating film 48 shares the same layer with a gate insulating film of the thin film transistors 40.

On the first insulating film 48 there is formed a semiconductor active layer 50 of, e.g., i-type a-Si. The semiconductor active layer 50 shares the same layer with a channel layer of the thin film transistors 40. On the semiconductor active layer 50 there are formed the source electrodes 40s of the metal layer 52 of, e.g., Al, Cl or others, and counter electrodes 52a of the capacitors 44.

A second insulating film 54 of, e.g., an SiN film, a two-layer film of an $SiO_2$ film and an SiN film, or others, is formed on the metal layer 52. In the second insulating film 54, contact holes are formed on the source electrodes 40s and the counter electrodes 52a.

An transparent electrode film 56 of, e.g., ITO or others, is formed on the second insulating film 54. The transparent electrode film 56 forms the picture element electrodes 42 and is connected to the source electrodes 40s and the counter electrodes 52a through the contact holes.

The bumps 28 of the drain bus lines 16 of the thin film transistor matrix device will be detailed with reference to the plan view of FIG. 2 and the A–A' sectional view in FIG. 4.

The first insulating film 48 is formed on the transparent insulating substrate 10. The semiconductor active layer 50 and the metal layer 52 are laid on the first insulating film 48. The second insulating film 53 is formed on the metal layer 52. Contact holes are formed in the second insulating film 54 on the metal layer 52. The transparent electrode film 56 is formed on the second insulating film 54. The transparent electrode film 56 is connected to the metal layer 52 through the contact holes. The bumps 28 are constituted by the transparent electrode film 56 and the metal layer 52. The drain connection line 34 commonly connecting the drain bus lines 16, and the thin connection lines 26 share the metal layer 52 with the bumps 28.

The bumps 18 of the gate bus lines 14 of the thin film transistor matrix device will be explained with reference to the plan view of FIG. 2 and the B–B' sectional view in FIG. 4.

The metal layer 46 is formed on the transparent insulating film 10. The first insulating film 48 and the second insulating film 54 are formed on the metal layer 46. Contact holes are formed in the first and the second insulating films 48, 54 on the metal layer 46. The transparent electrode film 56 is formed on the second insulating film 54. The transparent electrode film 56 is connected to the metal layer 46 through the contact holes. The transparent electrode film 56 and the metal layer 46 constitute the bumps 18. The bumps 18 may be constituted by one of the transparent electrode film 56 and the metal layer 46. The gate connection line 24 commonly connecting the gate bus lines 14, and the thin connection lines 26 share the metal layer 46 with the bumps 18.

A liquid crystal panel is constituted by the above-described thin film transistor matrix device. An opposed substrate (not shown) having a color filter formed thereon is prepared, and a liquid crystal is sandwiched between the thin film transistor matrix device and the opposed substrate, and the liquid crystal panel is prepared.

A circuit substrate (not shown) for the liquid crystal panel, which includes peripheral circuits, such as a drive circuit, is prepared. The liquid crystal panel and the circuit substrate are connected by a connection line (not shown), such as a flexible cable or others, and a liquid crystal display unit is prepared.

1.2 Method for Fabricating the Thin Film Transistor Matrix Device

Then, the method for fabricating the thin film transistor matrix device according to the present embodiment will be explained with reference to FIGS. 5 and 6. In the this method five masks are used.

Figure 5A:
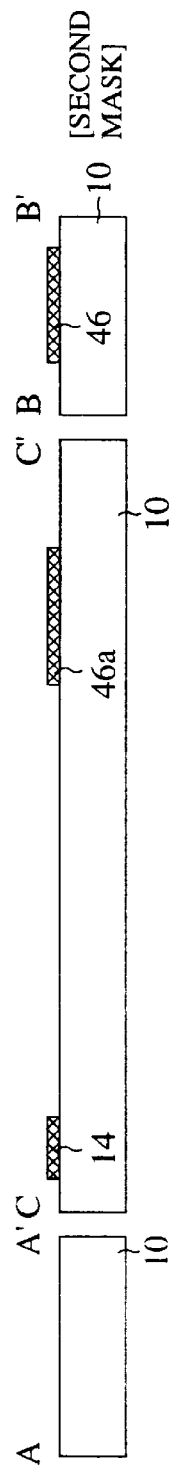
FIGS. 5A to 5D are sectional views of the thin film transistor matrix device according to the first embodiment of the present invention at the respective steps of a method for fabricating the same (Part 1).

First, the metal layer 46 of, e.g., Al, Cr or others is formed by sputtering on a transparent insulating substrate 19, such as a glass substrate or others. The metal layer 46 is patterned by the use of a first mask to form the gate bus lines 14, the gate electrodes 42a, the capacitor electrodes 46a, the metal layer 46 of the bumps 18, the gate connection line 24 and the thin connection lines 26 (FIG. 5A).

Then, the first insulating film 48 of an SiN film, a two-layer film of SiO$_2$ film and SiN film, or others is formed by plasma CVD.

Figure 5B:
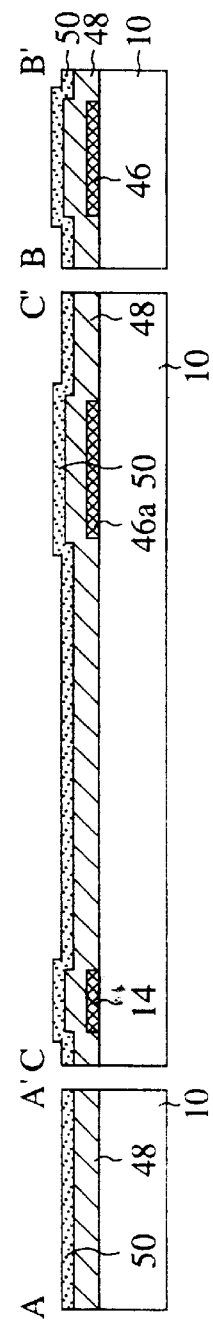

Next, the semiconductor active layer 50 of non-doped i-type a-Si and a protection film (not shown) of an SiO$_2$ film or an SiN film are continuously formed on the first insulating film 48 by plasma CVD (FIG. 5B). Subsequently all the protection film is etched off except a part thereof on the TFT channel region with a hydrofluoric acid buffer solution or others and by the use of a second mask.

Then, an n$^+$-type a-Si layer (not shown) is formed on the entire surface by plasma CVD.

Figure 5C:
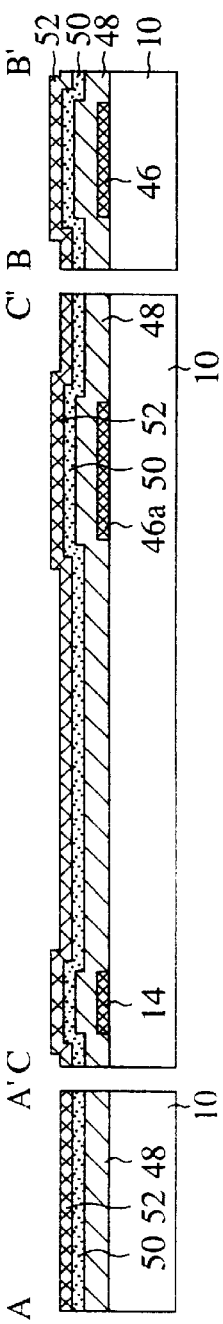

Then, the metal layer 52 of Al, Cr, or others is formed on the n$^+$-type a-Si layer by sputtering (FIG. 5C).

Figure 5D:
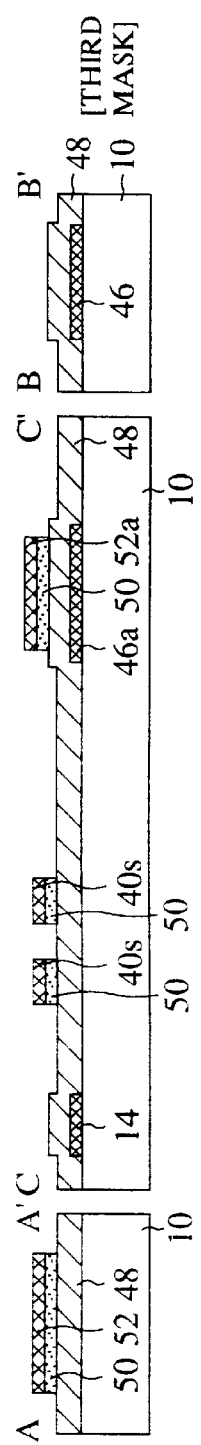

Then, by the use of a third mask, the metal layer 52 and the semiconductor active layer 50 are patterned to form the metal layers 52 of the bumps 28, the source electrodes 40s, the counter electrodes 52a, the drain electrodes 40d, drain bus lines 16, the drain connection line 34 and the thin connection lines 26 (FIG. 5D).

Next, the second insulation film 54 of an SiN film, a two-layer film of an SiO$_2$ film and an SiN film, or others is formed on the entire surface by plasma CVD (FIG. 6A).

Next, by the use of a fourth mask, the second insulation film 54 and the first insulation film 48 are patterned to form the contact holes for the bumps 28, the contact holes for the source electrodes 40s, the contact holes for the counter electrodes 52a, the contact holes for the bumps 18 and the contact hole for the resistant line 38 (FIG. 6B).

Then, the transparent electrode film 56 is formed on the entire surface by sputtering (FIG. 6C).

Next, by the use of a fifth mask, the transparent electrode film 56 is patterned to form the bumps 28, the picture element electrodes 42, the resistant line 38 (FIG. 6D). The resistant line 38 is so patterned that the end of the gate connection line and the end of the drain connection line 34 are connected with each other.

Thus, by the use of 5 masks, the thin film transistor matrix device is fabricated.

According to the present embodiment, the gate bus lines 14 are commonly connected to the gate connection line 24 through the thin connection lines 26, and the drain bus lines 16 are commonly connected to the drain connection line 34 through the thin connection lines 36, whereby in the processes for fabricating the thin film transistors and the liquid crystal panel, no local charges are present even when electrostatic charges are applied, and electric stresses can be mitigated.

After the fabrication processes in which electrostatic charges, etc. are applied are over, the thin connection lines 26, 36 are melted off by a laser or other to electrically disconnect the gate bus lines 14 from the gate connection line 24 and the drain bus lines 16 from the drain connection line 34.

2. A Second Embodiment

The thin film transistor matrix device according to a second embodiment of the present invention will be explained with reference to FIGS. 7 and 8.

Figure 7:
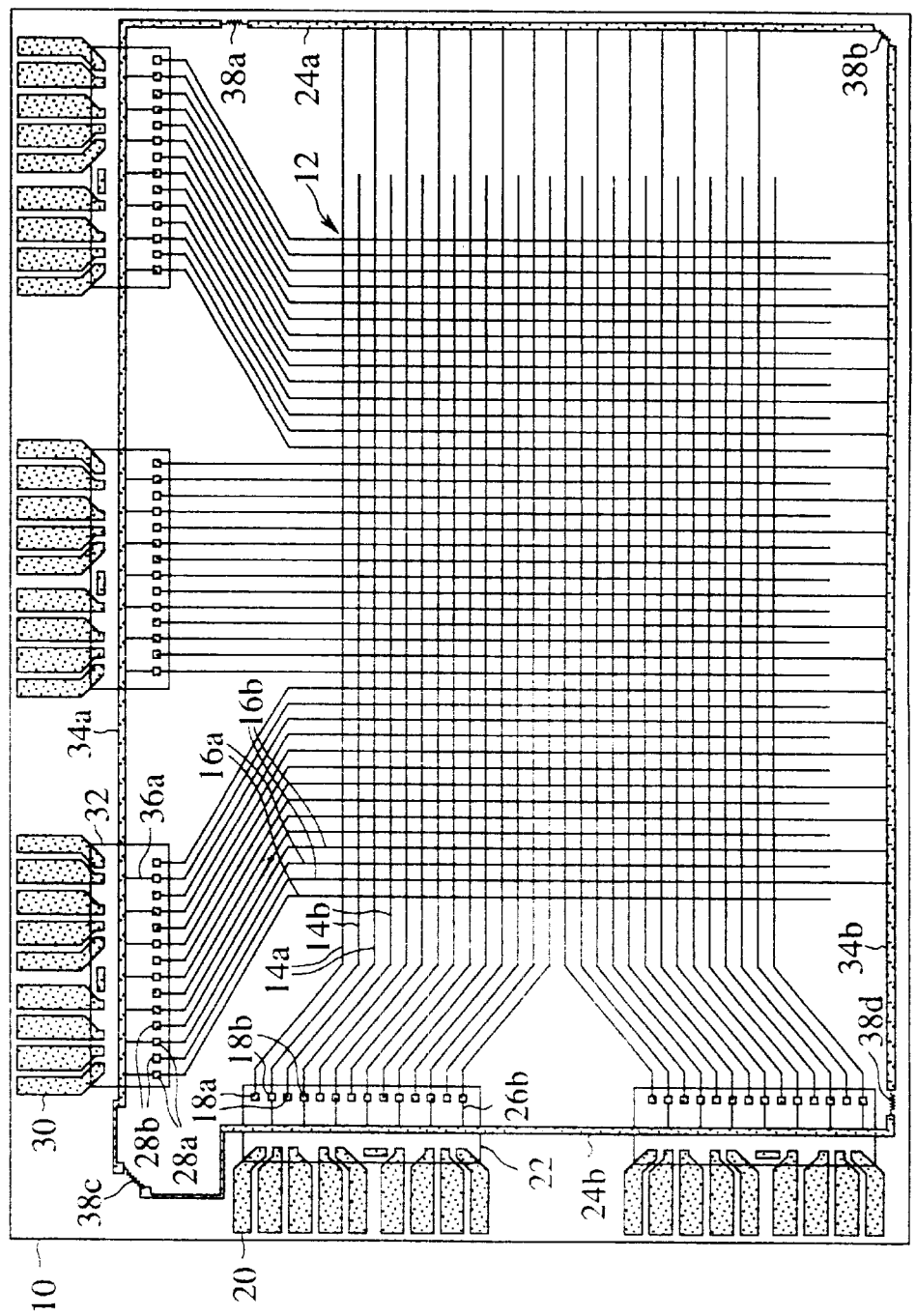
FIG. 7 is a plan view of the thin film transistor matrix device according to a second embodiment of the present invention.

FIG. 7 shows a pattern layout of the thin film transistor matrix device according to the present embodiment. FIG. 8 is an enlarged view of the wiring region of the thin film transistor matrix device of FIG. 7. The same members and members of the same kinds of the thin film transistor matrix device according to the present embodiment as those of the thin film transistor matrix device according to the first embodiment are represented by common reference numerals to simplify or not to repeat their explanation.

The thin film transistor matrix device according to the present embodiment is characterized in that adjacent ones 14a, 14b of a plurality of gate bus lines 14 are respectively commonly connected, and adjacent ones 16a, 16b of a plurality of drain bus lines 16 are respectively commonly connected.

Figure 8:
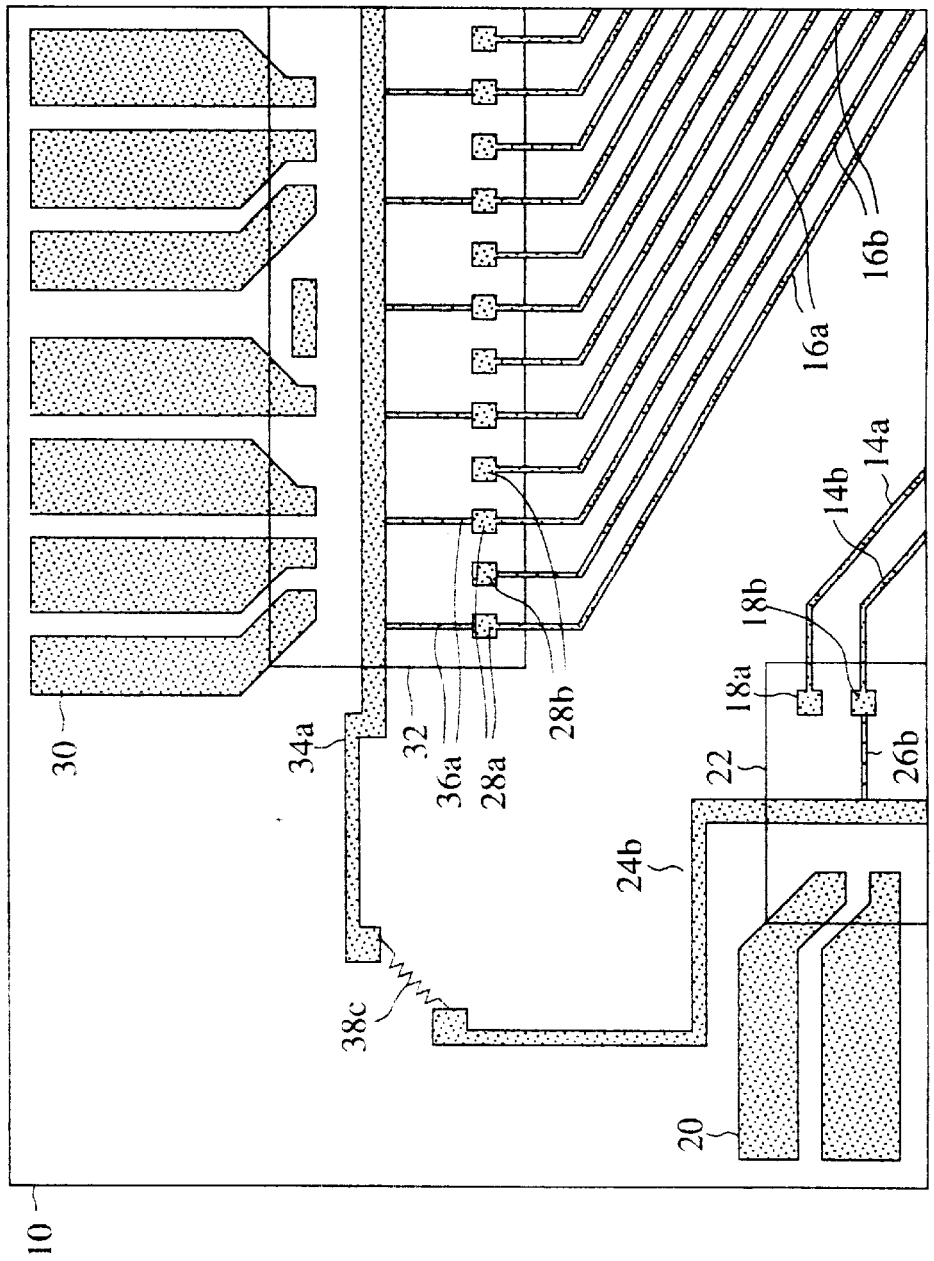
FIG. 8 is an enlarged plan view of the thin film transistor matrix device of FIG. 7.

As shown in FIGS. 7 and 8, a plurality of gate bus lines 14 are divided in odd number-th gate bus lines 14a and even number-th gate bus lines.

The odd number-th gate bus lines 14a have bumps 18a formed on the ends on the left side as viewed in FIG. 7 and have the ends on the right side as viewed in FIG. 7 commonly connected to a gate connection line 24a. The gate connection line 24a is extended along the edge of a transparent insulating substrate 10.

The even number-th gate bus lines 14b have the bumps 18b formed on the ends on the left side as viewed in FIG. 7. The bumps 18b are commonly connected to the gate connection line 24b through thin connection lines 26b. The gate connection line 24b is extended longitudinally in an IC chip region 22 between input terminals 20 and the bumps 18b.

Odd number-th drain bus lines 16a have bumps 28a formed on the ends on the upper side as viewed in FIG. 7. The bumps 28a are commonly connected to a drain connection line 34a through thin connection lines 36a. The drain connection line 34a is extended widthwise in th IC chip region 32 between the input terminals 30 and the bumps 28a.

The even number-th drain bus lines 16b have the bumps 29b formed on the end on the upper side as viewed in FIG. 7 and the ends on the lower end commonly connected to a drain connection line 34b. The drain connection line 34b is extended along the lower edge of the transparent insulating substrate 10.

The gate connection lines 24a, 24b and the drain connection lines 34a, 34b are interconnected by resistant lines 38a, 38b, 38c, 38d. The resistant line 38a interconnects the gate connection line 24a and the drain connection line 34a; the resistant line 38b interconnects the gate connection line 24a and the drain connection line 34b; the resistant line 38c interconnects the gate connection line 24b and the drain connection line 34a; and the resistant line 38d interconnects the gate connection line 24b and the drain connection line 34b.

Thus, according to the present embodiment, the gate bus lines 14a, 14b are respectively commonly connected to the gate connection lines 24a, 24b. The drain bus lines 16a, 16b are respectively commonly connected to the drain connection lines 34a, 34b, whereby in the processes for fabricating the thin film transistors and the liquid crystal panel, no local charges are present even when electrostatic charges are applied, and electric stresses can be mitigated.

For higher inspection precision, a test in which different voltages are applied to adjacent gate bus lines and also to adjacent drain bus lines is preferred to a test in which the same voltage is applied to all the gate bus lines and to all the drain bus lines. According to the present embodiment, adjacent ones 14a, 14b of the gate bus lines 14 are respectively commonly connected, and adjacent ones 24a, 24b of the drain bus lines 24 are respectively commonly connected, whereby tests of high precision can be conducted even by applying different voltages to adjacent gate bus lines and also to adjacent drain bus lines.

3. A Third Embodiment
3.1 Thin Film Transistor Matrix Device

Figure 10:
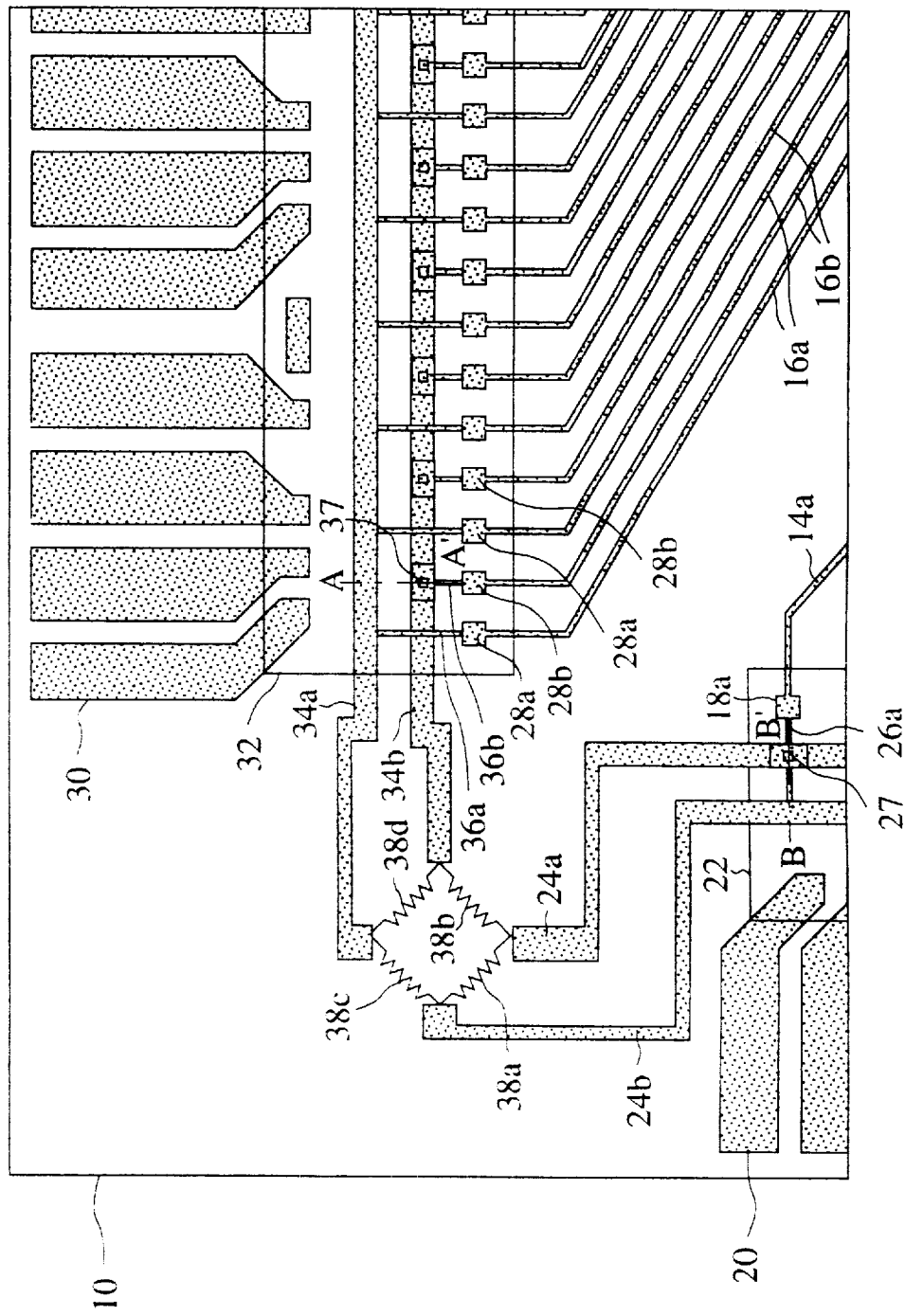
FIG. 10 is an enlarged plan view of the thin film transistor matrix device of FIG. 9.
Figure 11:
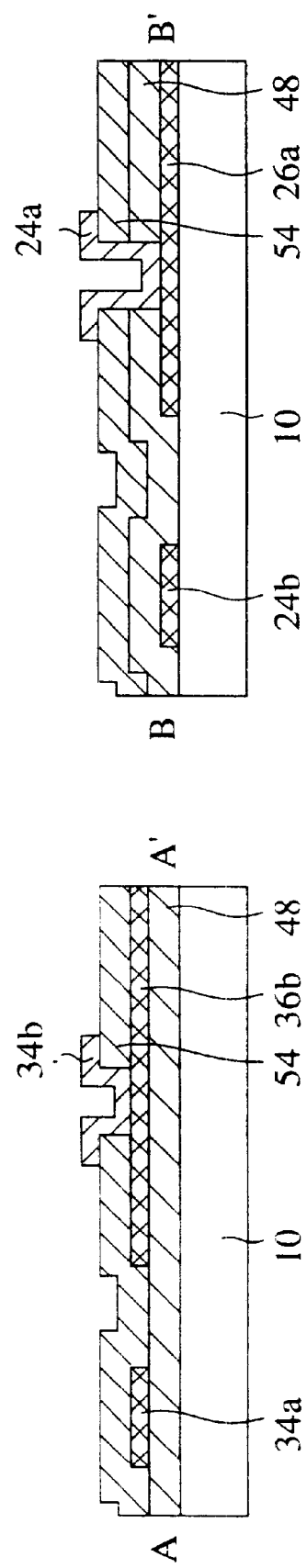
FIG. 11 is sectional views of the thin film transistor matrix device of FIG. 10.

The thin film transistor matrix device according to a third embodiment of the present invention will be explained with reference to FIGS. 9 to 11.

Figure 9:
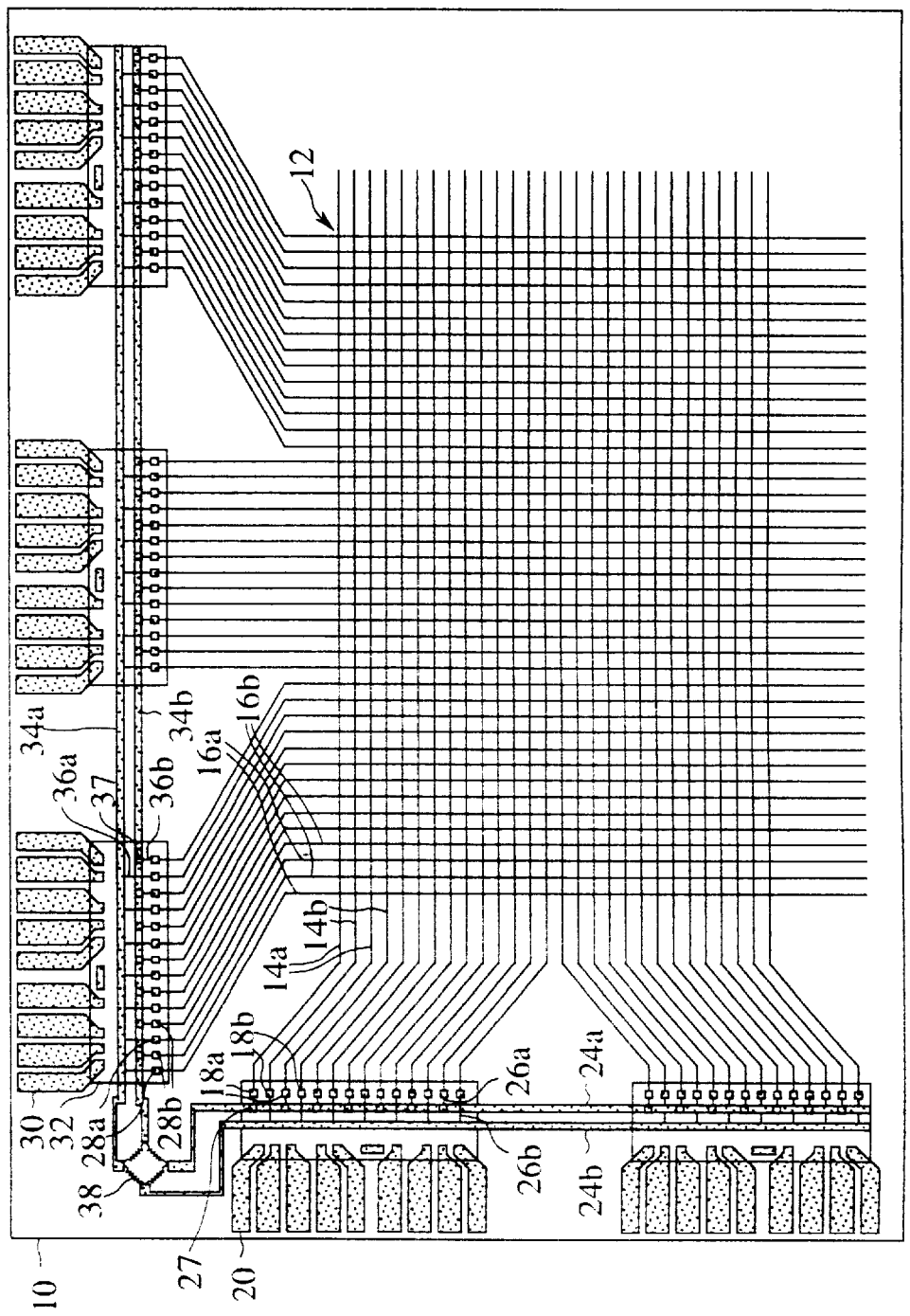
FIG. 9 is a plan view of the thin film transistor matrix device according to a third embodiment of the present invention.

FIG. 9 shows a pattern layout of the thin film transistor matrix device according to the present embodiment. FIG. 10 is an enlarged view of the wiring region of the thin film transistor matrix device of FIG. 9. FIG. 11 is a sectional view of the thin film transistor matrix device of FIG. 9. The same members or members of the same kinds of the thin film transistor matrix device according to the present embodiment as those of the thin film transistor matrix device according to the first and the second embodiments are represented by common reference numerals to simplify or not to repeat their explanation.

The thin film transistor matrix device according to the present embodiment is characterized in that adjacent ones 14a, 14b of a plurality of gate bus lines 14 are respectively commonly connected, and adjacent ones 16a, 16b of a plurality of drain bus lines 16 are respectively commonly connected; and gate connection lines 24a, 24b which commonly connect respectively the gate bus lines 14a, 14b are arranged on the same side of a transparent insulating substrate, and drain connection lines 34a, 34b which commonly connect respectively the drain bus lines 16a, 16b are arranged on the same side of the transparent insulating substrate 10.

The plane layout of the thin film transistor matrix device according to the present embodiment will be explained with reference to FIGS. 9 and 10.

A plurality of gate bus lines 14 are divided in odd number-th gate bus lines 14a and even number-th gate bus lines 14b which are adjacent to each other.

Bumps 18a are formed on the ends of the odd number-th gate bus lines 14a on the left side as viewed in FIG. 9. The bumps 18a are commonly connected to the gate connection line 24a through thin connection lines 26a and contact holes 27.

Bumps 18b are formed on the ends of the odd number-th gate bus lines 14b on the left side as viewed in FIG. 9. The bumps 18b are commonly connected to the gate connection line 24b through thin connection lines 26.

The gate connection lines 24a, 24b are extended longitudinally through an IC chip region 22 between input terminals 20 and the bumps 18a, 18b.

Bumps 28a are formed on the ends of the odd number-th bus lines 16a on the upper side as viewed in FIG. 9. The bumps 28a are commonly connected to the drain connection line 34a through thin connection lines 36a and contact hole 37.

Bumps 28b are formed on the ends of the even number-th drain bus lines 16b on the upper end as viewed in FIG. 9. The bumps 28b are commonly connected to the drain connection line 34b through thin connection lines 36b.

The drain connection lines 34a, 34b are extended transversely through an IC chip region 32 between input terminals 30 and the bumps 28a, 28b.

The gate connection lines 24a, 24b and the drain connection lines 34a, 34b are connected with each other by resistant lines 38a, 38b, 38c, 38d. The resistant line 38a interconnects the gate connection line 24a and the gate connection line 24b; the resistant line 38b interconnects the gate connection line 24a and the drain connection line 34b; the resistant line 38c interconnects the gate connection line 24b and the drain connection line 34a; and the resistant line 38d interconnects the drain connection line 34a and the drain connection line 34b.

Then, a sectional structure of the thin film transistor matrix device according to the present embodiment will be explained with reference to FIG. 11.

A sectional structure of the vicinity of the drain connection lines 34a, 34b will be explained with reference to the plan view of FIG. 10 and the sectional view along the line A–A'.

A first insulating film 48 is formed on a transparent insulating substrate 10. On the first insulating film 48, the thin connection lines 36b and the drain connection line 34a are formed of the same layer as a semiconductor active layer 50 and a metal active layer 52. A second insulating film 54 is formed on the metal layer 52, and the contact holes 37 are formed on the second insulating film 54. On the second insulating film 54 the drain connection line 34b is formed of the same layer as an transparent electrode film. The drain connection line 34b is connected to the thin connection lines 36b through the contact holes 37.

A sectional structure of the vicinity of the gate connection lines 24a, 24b will be explained with reference to the plan view of FIG. 10 and the B–B' sectional view of FIG. 11.

On the transparent insulating substrate 10, the gate connection line 24b and the thin connection lines 26a are formed of the same layer as a metal layer 46. The first and the second insulating films 48, 54 are formed on the metal layer 46. The contact holes 27 are formed in the first and the second insulating films 48, 54 on the thin connection lines 26a. The gate connection line 24a is connected to the thin connection lines 26a through the contact holes 27.

3.2 A First Fabrication Method

Then, the method for fabricating the thin film transistor matrix device according to the present embodiment will be explained with reference to FIGS. 12 to 17. FIGS. 12A–12D and 13A–13D are A–A' sectional views and B–B' sectional views of the thin film transistor matrix device at the respective steps of the first fabrication method. FIGS. 14 to 17 are enlarged plan views of the thin film transistor matrix device at the respective fabrication steps.

The thin film transistor matrix device according to the present embodiment has the gate connection lines 24a, 24b formed on the layers which are different from each other but can be fabricated by the use of 5 masks as in the first embodiment.

Figure 12A:
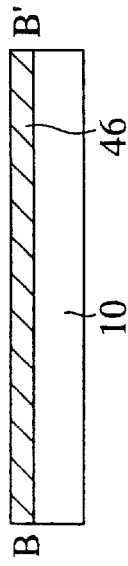
FIGS. 12A to 12D are sectional views of the thin film transistor matrix device according to the third embodiment of the present invention at the respective steps of a first method for fabricating the same (Part 1).

The metal layer 46 of, e.g., Al, Cr or others is formed by sputtering on a transparent insulating substrate 10, such as a glass substrate or others (FIG. 12A).

Figure 12B:
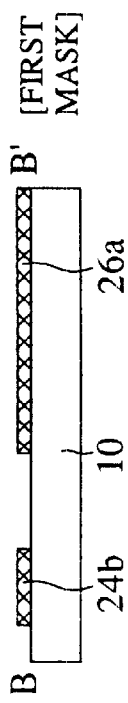
Figure 14:
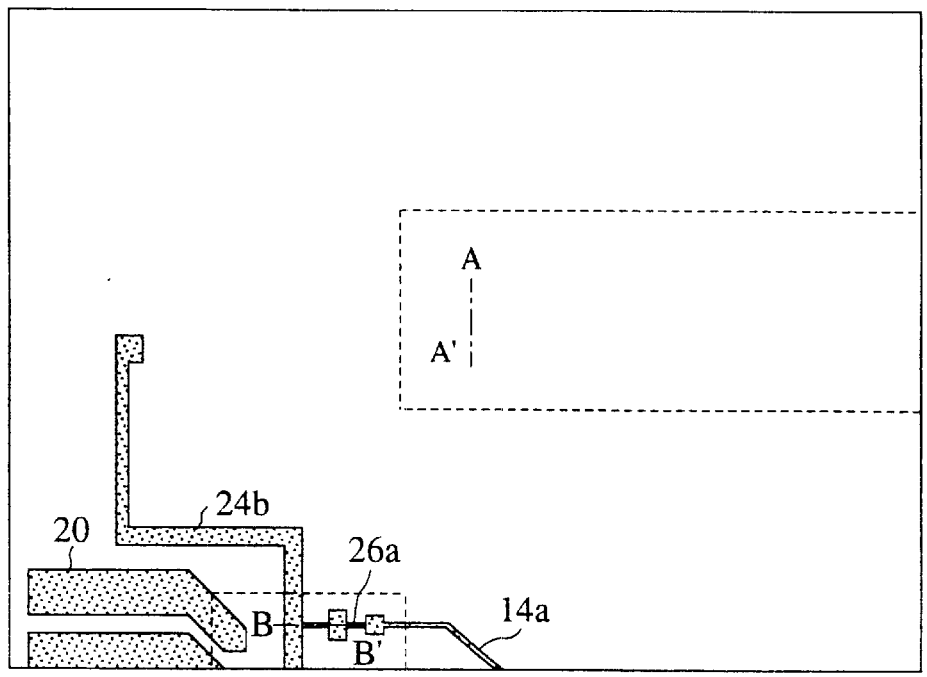
FIG. 14 is a plan view of the thin film transistor matrix device according to the third embodiment of the present invention at the respective steps of the first method for fabricating the same (Part 1).

Then, by the use of a first mask, the metal layer 46 is patterned to form the gate bus lines 14a, 14b, the gate electrodes 42a, capacitor electrodes 46, the gate connection line 24b, the thin connection lines 26a, 26b and input electrodes 20 (FIGS. 12B and 14).

Then the first insulating film 48 of an SiN film or a two layer film of an SiO$_2$ film and an SiN film is formed on the entire surface by plasma CVD.

Then, on the first insulating film, the semiconductor active layer 50 of non-doped i-type a-Si, and a protection layer (not shown) of an SiO$_2$ film or an SiN film are continuously formed. Subsequently, by the use of a second mask, all the protection film except part thereof in a TFT region is etched off with a hydrofluoric acid buffer solution.

Figure 12C:
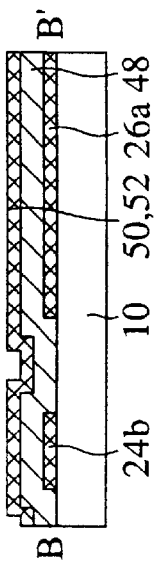

Then, an n$^+$-type a-Si layer (not shown) is formed on the entire surface by plasma CVD. Then, the metal layer 52 of Al, Cr or others is formed on the n$^+$-type a-Si layer by sputtering (FIG. 12C).

Figure 12D:
Figure 15:
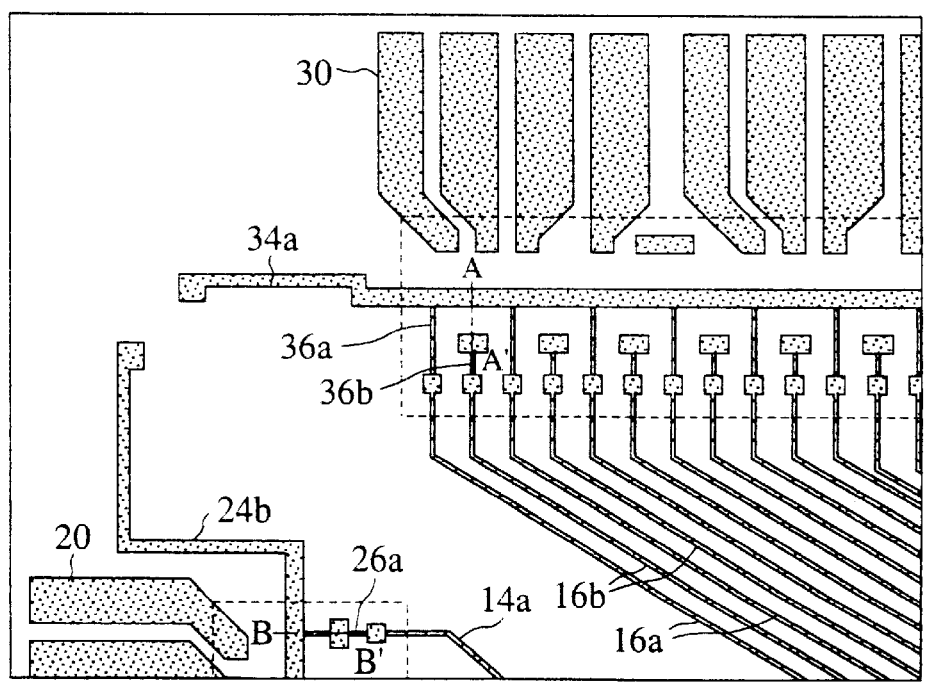
FIG. 15 is a plan view of the thin film transistor matrix device according to the third embodiment of the present invention at the respective steps of the first method for fabricating the same (Part 2).

The, by the use of a third mask, the metal layer 52 and the semiconductor active layer 50 are patterned to form the source electrodes 40s, the drain electrodes 40d, the drain bus lines 16a, 16b, the drain connection line 34a, the thin connection lines 36a, 36b and input electrodes 30 (FIGS. 12D and 15).

Figure 13A:
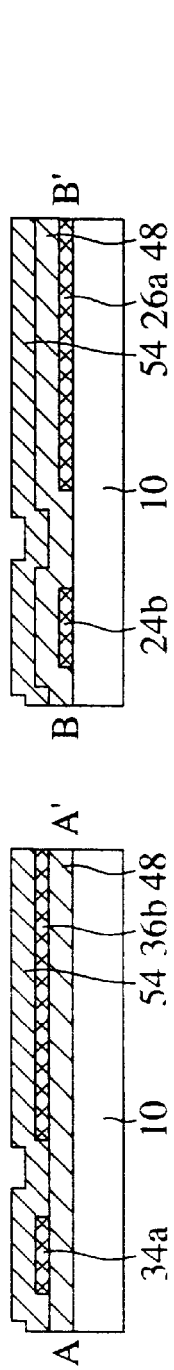
FIGS. 13A to 13D are sectional views of the thin film transistor matrix device according to the third embodiment of the present invention at the respective steps of the first method for fabricating the same (Part 2).

Then, the second insulating film 54 of an SiN film or a two layer film of an SiO$_2$ film and an SiN film is formed on the entire surface by plasma CVD (FIG. 13A).

Figure 13B:
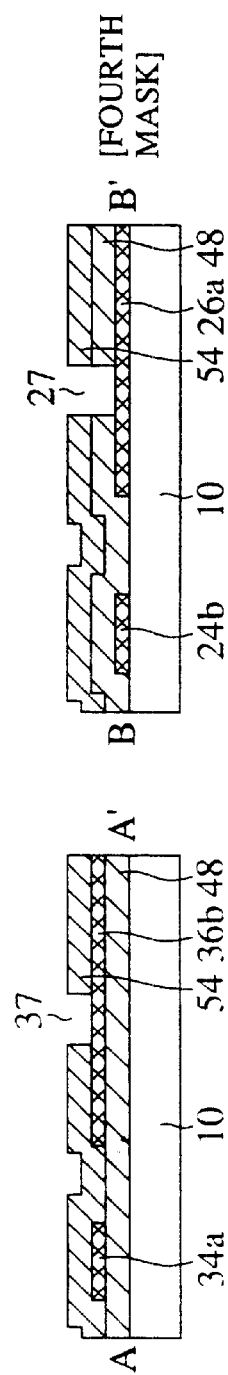
Figure 13C:
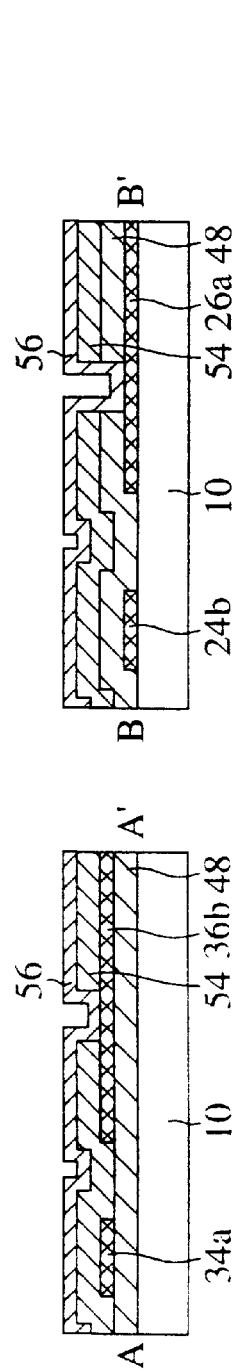
Figure 16:
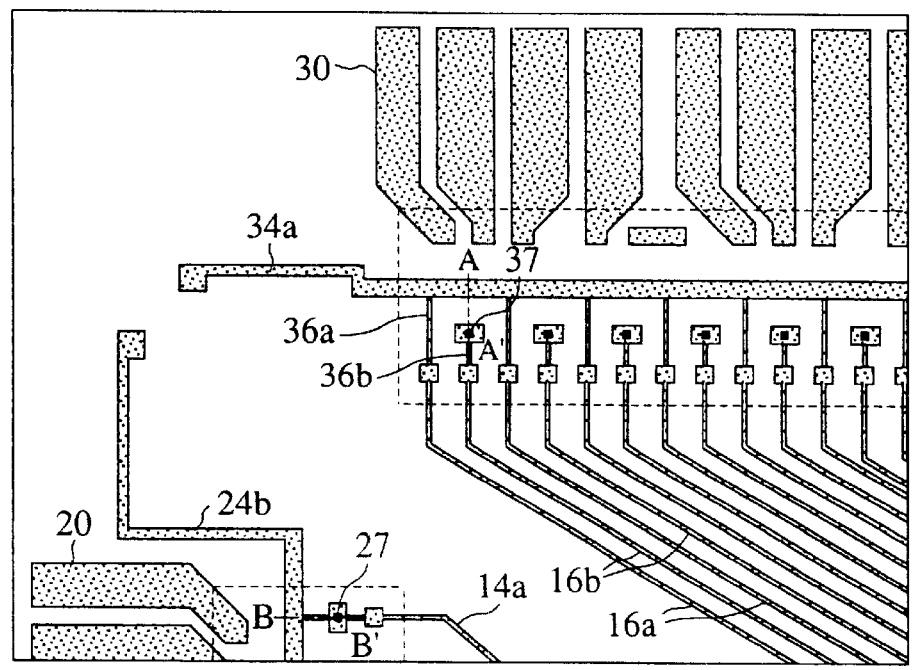
FIG. 16 is a plan view of the thin film transistor matrix device according to the third embodiment of the present invention at the respective steps of the first method for fabricating the same (Part 3).

Then, by the use of a fourth mask, the second insulation film 54 and the first insulation film 48 are patterned to form the contact holes 27, the contact holes 37, and contact holes for the resistant lines 38 (FIGS. 13B and 16).

Then, the transparent electrode film 56 is formed on the entire surface by sputtering (FIGS. 13B and 16).

Figure 13D:
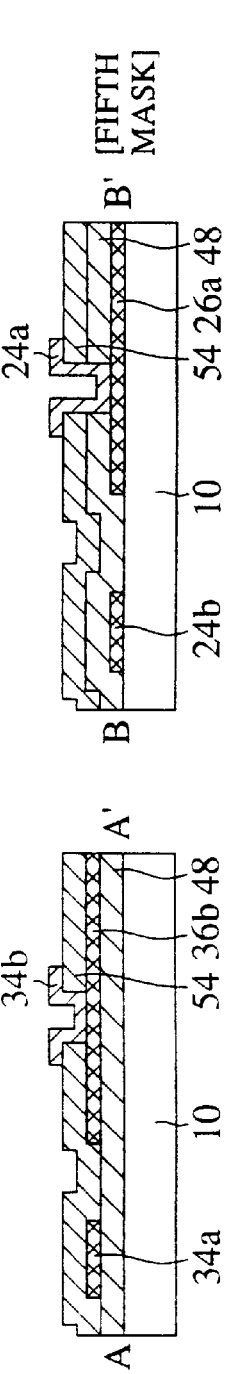
Figure 17:
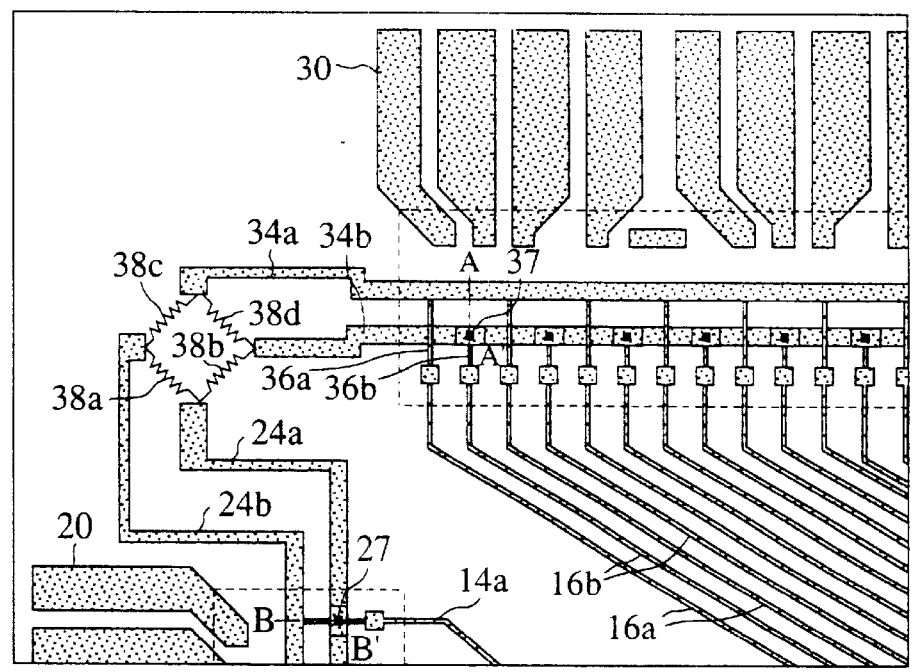
FIG. 17 is a plan view of the thin film transistor matrix device according to the third embodiment of the present invention at the respective steps of the first method for fabricating the same (Part 4).

Next, by the use of a fifth mask, the transparent electrode film 56 is patterned to form picture element electrodes 52, the gate connection line 34b, and the resistant lines 38a, 38b, 38c, 38d (FIGS. 13D and 17). The resistant lines 38A, 38B, 38C, 38D are patterned so as to interconnect the ends of the gate connection lines 24a, 24b, and the ends of the drain connection lines 34a, 34b.

Thus, as in the first embodiment, by the use of only 5 masks, the thin film transistor matrix device according to the present embodiment can be fabricated.

3.3 A Second Fabrication Method

Then, another method for fabricating the thin film transistor matrix device according to the present embodiment will be explained with reference to FIGS. 18 to 23. FIGS. 18A–18D and 19A–19C are respectively A–A' line sectional views and B–B' sectional views of the thin film transistor matrix device at the respective steps of the second fabrication method. FIGS. 20 to 23 are enlarged plan views of the thin film transistor matrix device at the respective steps of the second fabrication method.

In the first fabrication method, the contact hole 27 through which the gate connection line 24a and the gate connection line 24b are connected with each other is formed in the first insulating film 48 and the second insulating film 54. The gate connection line 24a and the gate connection line 24b define a too large step therebetween to be well connected with each other.

By the second fabrication method, one mask is added, whereby large steps are not formed between the lines connected with each other through the contact holes. The present embodiment uses 6 masks, which is 1 mask more than the first embodiment.

Figure 18A:
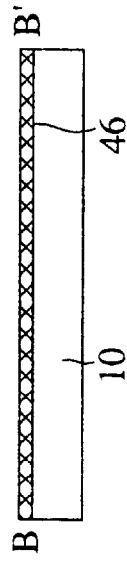
FIGS. 18A to 18D are sectional views of the thin film transistor matrix device according to the third embodiment of the present invention at the respective steps of a second method for fabricating the same (Part 1).

The metal layer 46 of, e.g., Al, Cr or others is formed on a transparent insulating substrate 10, such as a glass substrate by sputtering (FIG. 18A).

Figure 18B:
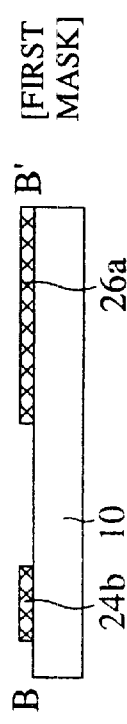
Figure 20:
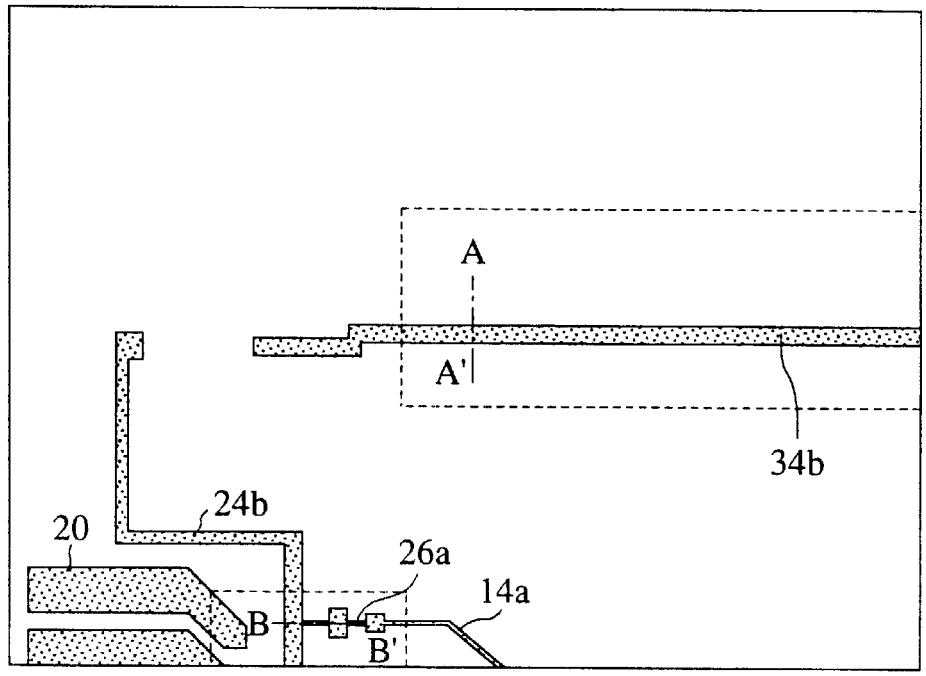
FIG. 20 is a plan view of the thin film transistor matrix device according to the third embodiment of the present invention at a step of the second method for fabricating the same (Part 1).

Then, the metal layer 46 is patterned by the use of a first mask to form the gate bus lines 14a, 14b, the gate electrodes 42a, the capacitor electrodes 46a, the drain connection line 34b, the gate connection line 24b, the thin connection lines 26a, 26b and the input electrodes 20 (FIGS. 18B and 20).

Figure 18C:
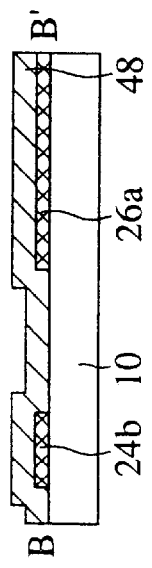

Then, the first insulating film 48 of an SiN film, a two-layer film of an SiO$_2$ film and an SiN film, or others on the entire surface by plasma CVD (FIG. 18C).

Next, on the first insulating film 48, the semiconductor active layer 48 of non-doped i-type a-Si and the protection film (not shown) of an SiO$_2$ film or an SiN film are continuously formed by plasma CVD. Subsequently, by the use of a second mask, all the protection film except a part thereof in the TFT channel region is etched off with a hydrofluoric acid buffer solution.

Figure 18D:
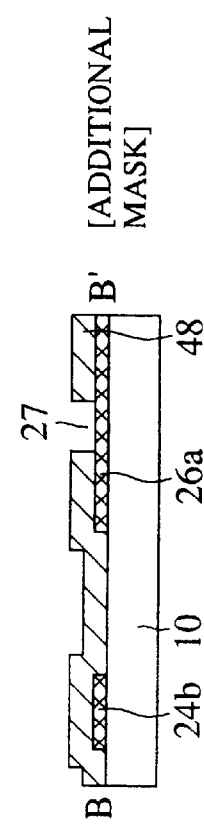
Figure 21:
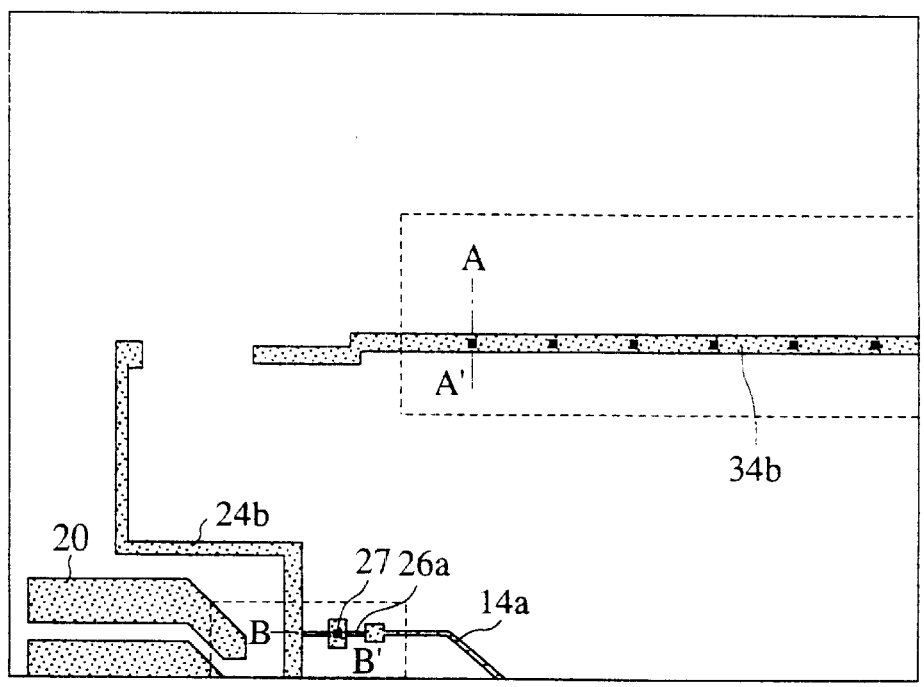
FIG. 21 is a plan view of the thin film transistor matrix device according to the third embodiment of the present invention at a step of the second method for fabricating the same (Part 2).

Then, by the use of an additional mask, the first insulating film 48 is patterned to form the contact holes 37 through which the drain connection line 34b and the thin connection lines 36b are connected with each other, and the contact holes 27 through which the thin connection lines 26a and the gate connection line 24a are connected with each other (FIGS. 18D and 21).

Next, the n$^+$-type a-Si layer (not shown) is formed on the entire surface by plasma CVD. Then, the metal layer 52 of Al, Cr or others is formed on the n$^+$-type a-Si layer by sputtering (FIG. 19A).

Figures 19A, 19B, 19C:
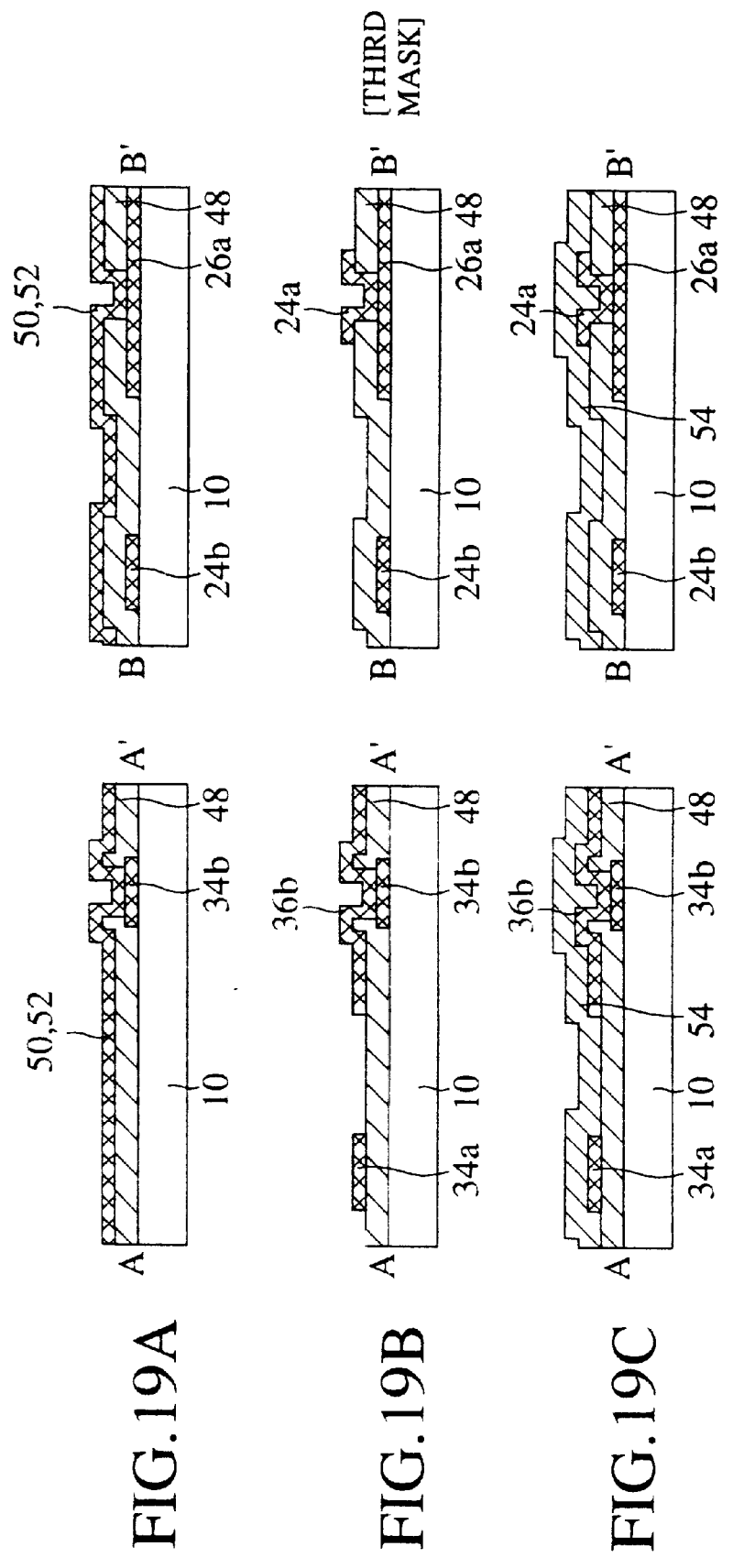
Figure 22:
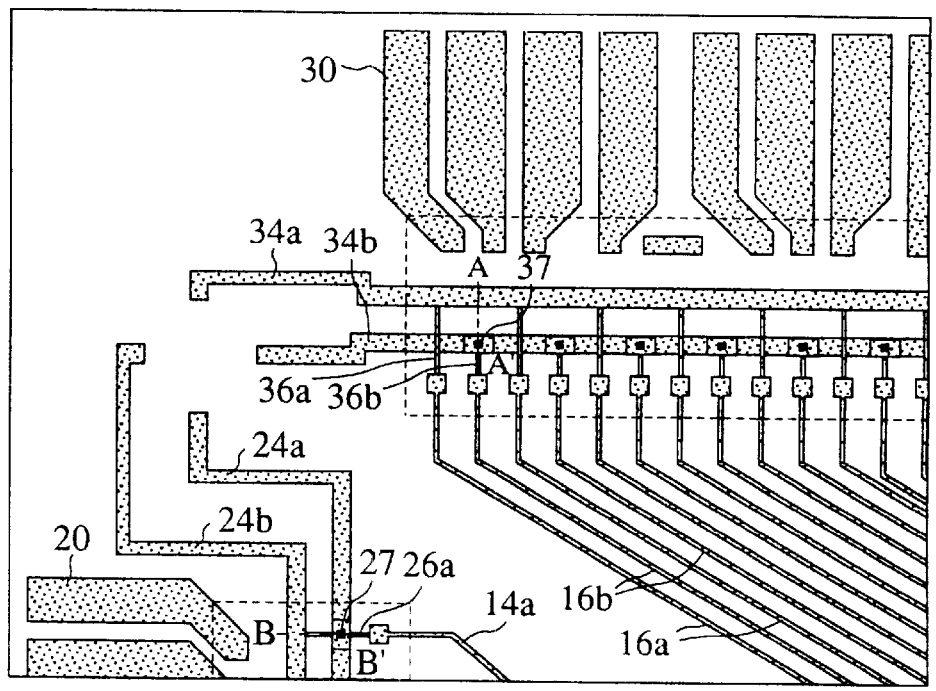
FIG. 22 is a plan view of the thin film transistor matrix device according to the third embodiment of the present invention at a step of the second method for fabricating the same (Part 3).

Then, by the use of a third mask, the metal layer 52 and the semiconductor active layer 50 are patterned to form the source electrodes 40s, the drain electrodes 40d, the drain bus lines 16a, 16b, the drain connection line 34a, the thin connection lines 36a, 36b, the gate connection line 24a and the input electrodes 30 (FIGS. 19B and 22).

Then, the second insulating film 54 of an SiN film, a two layer film of SiO$_2$ film and an SiN film, or others is formed on the entire surface by plasma CVD (FIG. 19C).

Next, by the use of a fourth mask, the second insulating film 54 and the first insulating film 48 are patterned to form the contact holes for the resistant lines 38.

Next, the transparent electrode film 56 is formed on the entire surface by sputtering.

Figure 23:
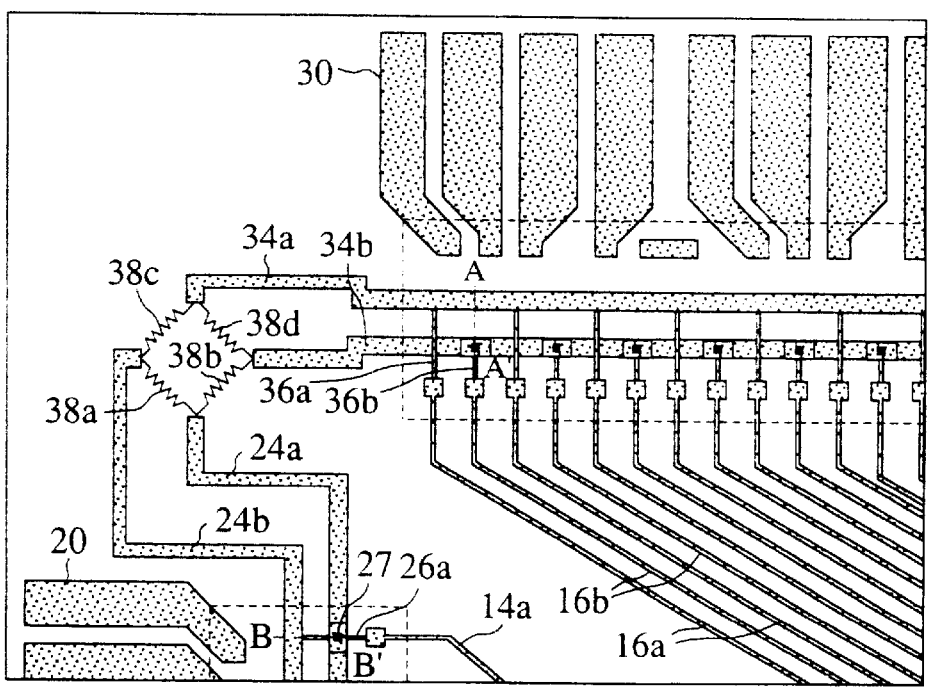
FIG. 23 is a plan view of the thin film transistor matrix device according to the third embodiment of the present invention at a step of the second method for fabricating the same (Part 4).

Then, by the use of a fifth mask, the transparent electrode film 56 is patterned to form the picture element electrodes 42, and the resistant lines 38a, 38b, 38c, 38d (FIG. 23).

Thus, totally 6 masks including the additional mask are used, whereby the gate connection line 24a and the gate connection line 24b define a small step therebetween, which enables good connection therebetween.

Thus, according to the present embodiment, the gate bus lines 14a, 14b are commonly connected respectively by the gate connection lines 24a, 24b, and the drain bus lines 16a, 16b are commonly connected respectively by the drain connection lines 34a, 34b, whereby in the process for fabricating the thin film transistors and the process for forming a liquid crystal panel, no local charge is present even when electrostatic charges are applied, whereby electric stresses can be mitigated.

For higher inspection precision, a test in which different voltages from each other are applied to the gate bus lines which are adjacent to each other and to the drain bus lines which are adjacent to each other is preferred to a test in which the same voltage is applied to all the gate bus lines and all the drain bus lines. According to the present embodiment, the gate bus lines 14a, 14b which are adjacent to each other are respectively commonly connected, and the drain bus lines 24a, 24b which are adjacent to each other are respectively commonly connected, whereby different voltages from each other are applied to the adjacent gate bus lines and the drain bus lines for high precision inspection.

4. A Fourth Embodiment 4.1 Thin Film Transistor Matrix Device

Figure 25:
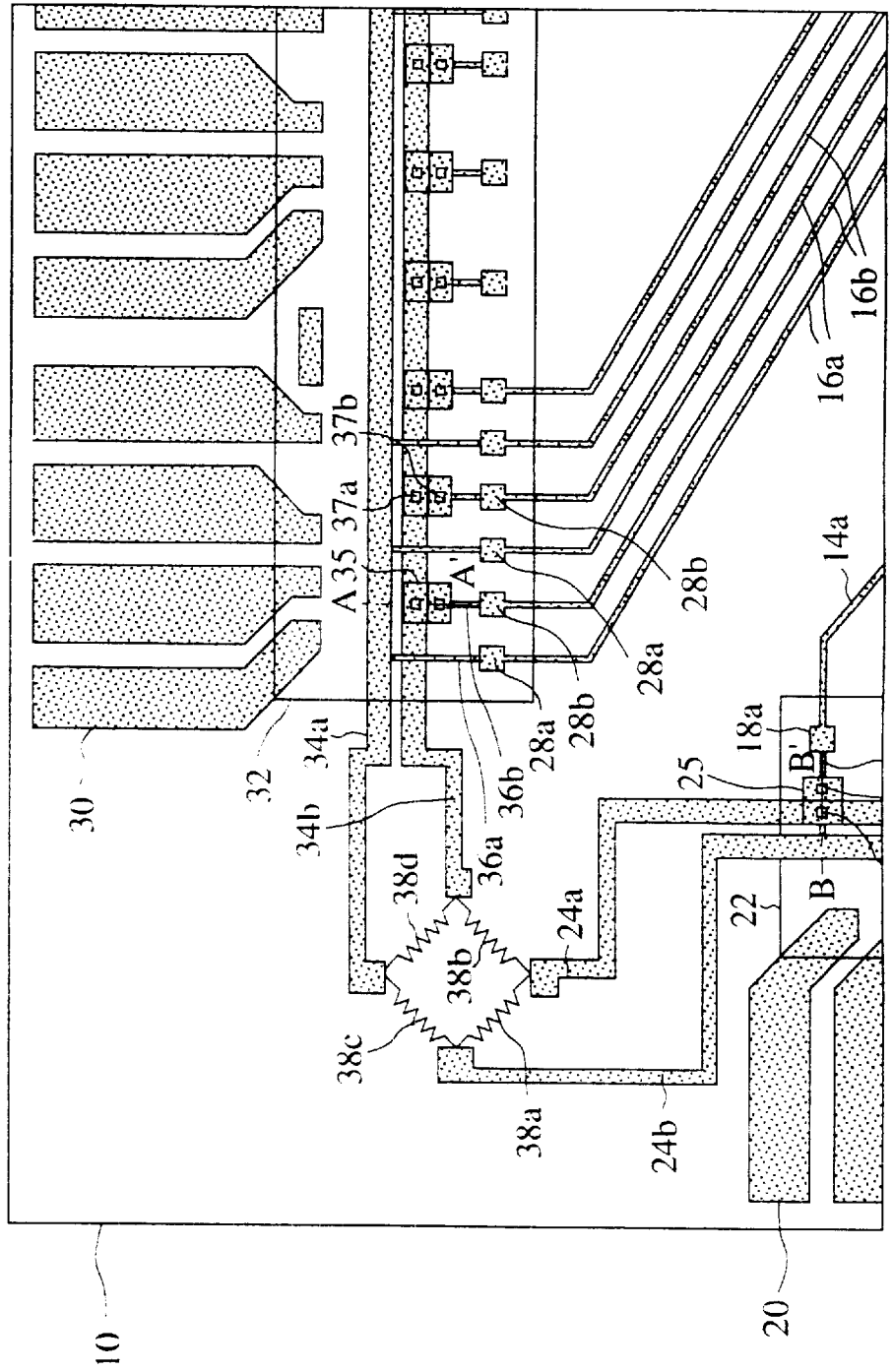
FIG. 25 is an enlarged plan view of the thin film transistor matrix device of FIG. 24.
Figure 26:
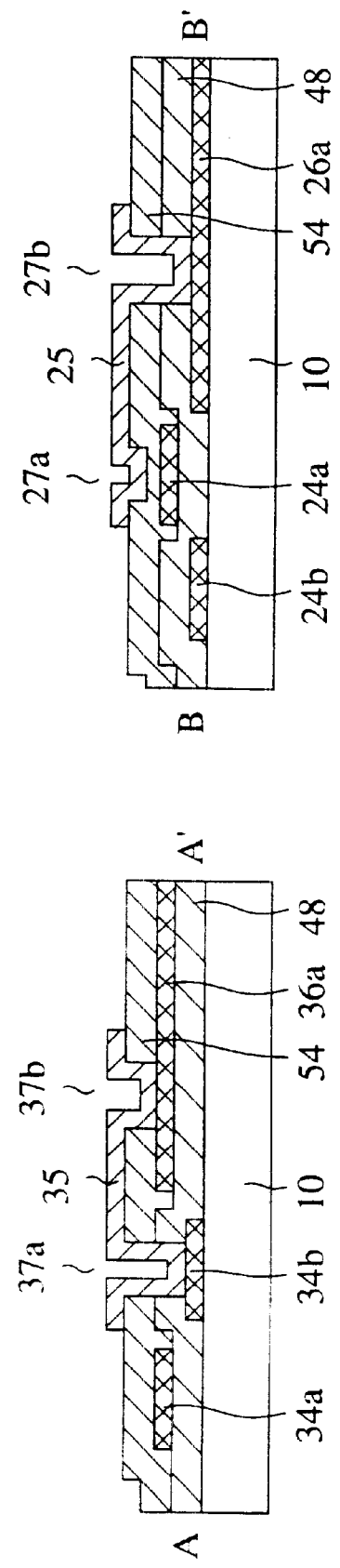
FIG. 26 is sectional views of the thin film transistor matrix device of FIG. 25.

The thin film transistor matrix device according to a fourth embodiment of the present invention will be explained with reference to FIGS. 24 to 26.

Figure 24:
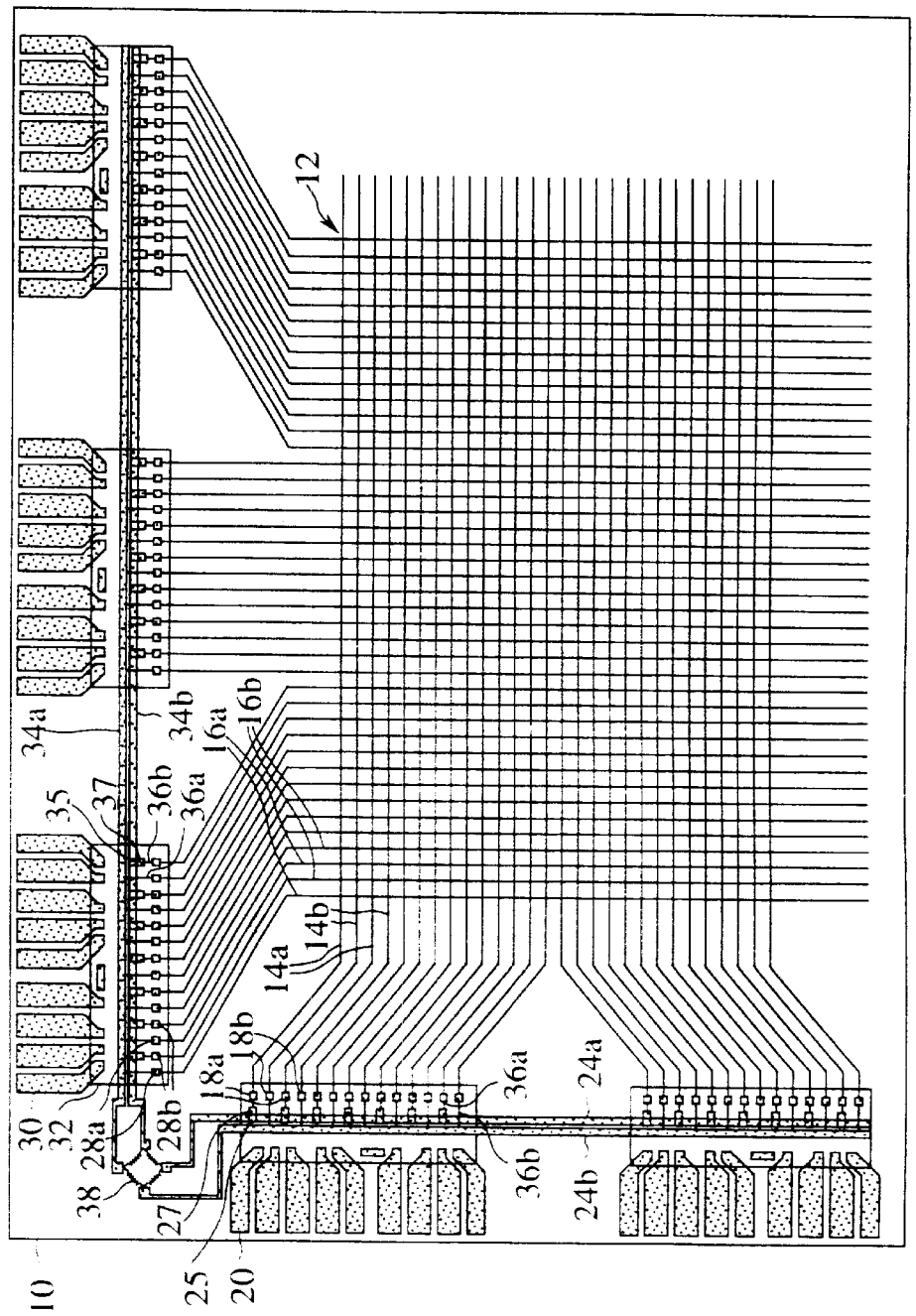
FIG. 24 is a plan view of the thin film transistor matrix device according to a fourth embodiment of the present invention.

FIG. 24 is a view of the pattern layout of the thin film transistor matrix device according to the present embodiment. FIG. 25 is an enlarged view of the wiring region of the thin film transistor matrix device of FIG. 24. FIG. 26 is sectional views of the thin film transistor matrix device of FIG. 24. The same members and members of the same kinds of the present embodiment as the thin film transistor matrix device according to the first to the third embodiments are represented by common reference numerals to simplify or not to repeat their explanation.

In the thin film transistor matrix device according to the present embodiment as well as the third embodiment, gate connection lines 24a, 24b respectively commonly connecting gate bus lines 14a, 14b which are adjacent to each other are arranged on the same side of a transparent insulating substrate 10, and drain connection lines 34a, 34b respectively commonly connecting drain bus lines 16a, 16b are arranged on the same side of the transparent insulating substrate 10, but the present embodiment is different from the third embodiment in the connection structure between the gate bus lines 14a, 14b and the gate connection lines 24a, 24b and that between the drain bus lines 16a, 16b and the drain connection lines 34a, 34b.

First, a layout of the thin film transistor matrix device according to the present embodiment in a plane will be explained with reference to FIGS. 24 and 25.

A plurality of gate bus lines 14 are divided into odd number-th gate bus lines 14a and even number-th gate bus lines 14b which are adjacent to each other.

Bumps 18a are formed on the ends of the odd number-th gate bus lines 14a on the right side as viewed in FIG. 24. The bumps 18a are commonly connected to the gate connection line 24a through thin connection lines 26a, contact holes 27b, a connection line 25 and contact holes 27a.

Bumps 18b are formed on the ends of the even number-th gate bus lines 14b on the left side as viewed in FIG. 24. The bumps 18b are commonly connected to the gate connection line 24b through thin connection lines 26b.

The gate connection lines 24a, 24b are extended longitudinally through an IC chip region 22 between inputs terminals 20 and the bumps 18a, 18b.

Bumps 28a are formed on the ends of the odd number-th drain bus lines 16a on the upper end as viewed in FIG. 24. The bumps 28a are commonly connected to the drain connection line 34a through thin connection lines 36a, contact holes 37b, a connection line 35 and contact holes 37a.

Bumps 28b are formed on the ends of the even number-th drain bus lines 16b on the upper end as viewed in FIG. 24. The bumps 28b are commonly connected to the drain connection line 34s through thin connection lines 36b.

The drain connection lines 34a, 34b are extended longitudinally through an IC chip region 32 between input terminals 30 and the bumps 28a, 28b.

Resistant lines 38a, 38b, 38c, 38d interconnect the gate connection lines 24a, 24b and the drain connection lines 34a, 34b. The resistant line 38a interconnects the gate connection line 24a and the gate connection line 24b; the resistant line 38b interconnects the gate connection line 24a and the drain connection line 34b; the resistant line 38c interconnects the gate connection line 24b and the drain connection line 34a; and the resistant line 38d interconnects the drain connection line 34a and the drain connection line 34b.

Then, a sectional structure of the thin film transistor matrix device according to the present embodiment will be explained.

A sectional structure of the vicinity of the drain connection lines 34a, 34b will be explained with reference to the plan view of FIG. 25 and the sectional view along the line A–A' in FIG. 26.

On a transparent insulating substrate 10, the drain connection line 34b of the same layer as the metal layer 46 is formed. A first insulating film 48 is formed on the transparent insulating film 10 and the drain connection line 34b. On the first insulating film 48, the thin connection line 36b and the drain connection lines 34a of the same layer as the semiconductor active layer 50 and the metal layer 52. A second insulating film 54 is formed on the metal layer 52. The contact holes 37a are formed in the first and the second insulating films 48, 54 and reach the drain connection line 34b. The contact holes 37b are formed in the second insulating film 54 and reach the thin connection lines 36b. The connection line 35 of the same layer as an transparent electrode film 56 is formed on the second insulating film 54 and interconnect the thin connection lines 36b and the drain connection line 34b through the contact holes 37a, 37b.

A sectional structure of the vicinity of the gate connection lines 24a, 24b will be explained with reference to the plan view of FIG. 25 and a sectional view along the line B–B' in FIG. 26.

On the transparent insulating substrate 10, the gate connection line 24b and the thin connection lines 26b of the same layer as the metal layer 46 are formed. On the metal layer 46, the first insulating film 48 is formed. On the fist insulating film 48, the gate connection line 24a of the same layer as the semiconductor active layer 50 and the metal layer 52 is formed. The second insulating film 54 is formed on the first insulating film 54 and the gate connection line 24a. The contact holes 27a are formed in the second insulating film 54 and reach the gate connection line 24a. The contact holes 27b are formed in the first and the second insulating films 48, 54 and reach the thin connection lines 26a. On the second insulating film 54, the connection line 25 of the same layer as the transparent electrode film 56 is formed and interconnects the thin connection lines 26a and the gate connection line 24b through the contact holes 27a, 27b.

4.2 Fabrication Method

Then, the method for fabricating the thin film transistor matrix device according to the present embodiment will be explained with reference to FIGS. 27 to 32. FIGS. 27A–27D and 28A–28D are sectional views of the thin film transistor matrix device according to the present embodiment at the respective step of the fabrication method, which are along the lines A–A' and the line B–B'. FIGS. 29 to 32 are enlarged plan views of the thin film transistor matrix device at the respective steps of the fabrication method.

In the present embodiment, although the gate connection lines 24a, 24b and the drain connection lines 34a, 34b are formed of the different layers, the thin film transistor matrix device according to the present embodiment can be fabricated by the use of only 5 masks as in the first embodiment.

Figure 27A:
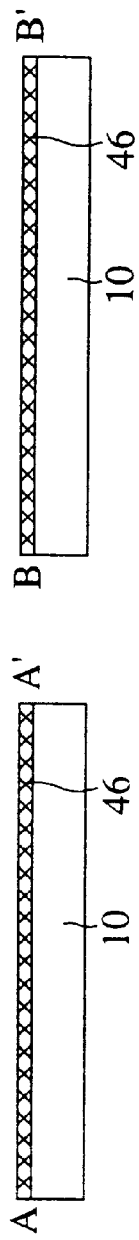
FIGS. 27A to 27D are sectional views of the thin film transistor matrix device according to the fourth embodiment of the present invention at the respective steps of a first method for fabricating the same (Part 1).

First, the metal layer 46 of, e.g., Al. Cr or others is formed on a transparent insulating substrate 10, such as a glass substrate by sputtering (FIG. 27A).

Figure 27B:
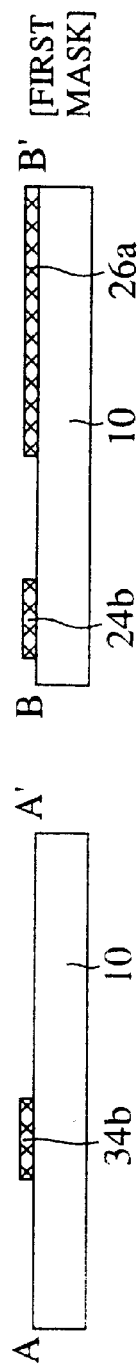
Figure 29:
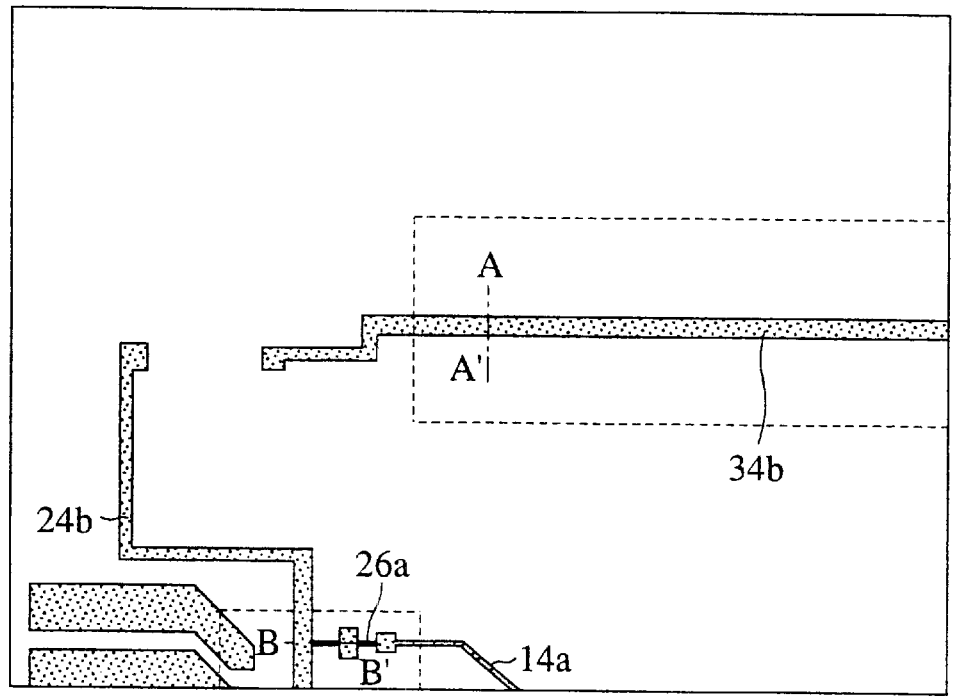
FIG. 29 is a plan view of the thin film transistor matrix device according to the fourth embodiment of the present invention at a step of the first method for fabricating the same (Part 1).

Next, by the use of a first mask, the metal layer 46 is patterned to form the drain connection line 34b, the gate bus lines 14a, 14b, gate electrodes 42a, capacitors 46a, the gate connection line 24b, the thin connection lines 26a, 26b, and input electrodes 20 (FIGS. 27B and 29).

The first insulating film 48 of an SiN film, a two-layer film of an $SiO_2$ film and an SiN film or others is formed on the entire surface by plasma CVD.

Then, on the insulating film 48, the semiconductor active layer of non-doped i-type a-Si and a protection film (not shown) of an $SiO_2$ film or an SiN film are continuously formed. Subsequently by the use of a second mask, all the protection film except a part thereof in a TFT channel region is etched off with a hydrogen fluoride buffer solution.

Figure 27C:
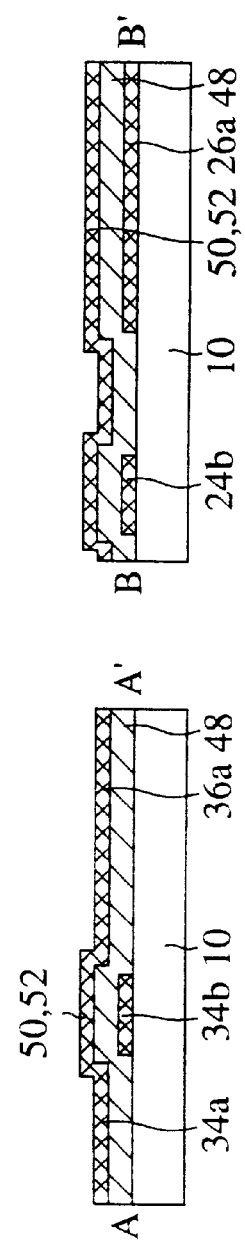

Then, an $n^+$-type a-Si film (not shown) is formed on the entire surface by plasma CVD. Then, the metal layer 52 of Al, Cr or others is formed on the $n^+$-type a-Si layer by sputtering (FIG. 27C).

Figure 27D:
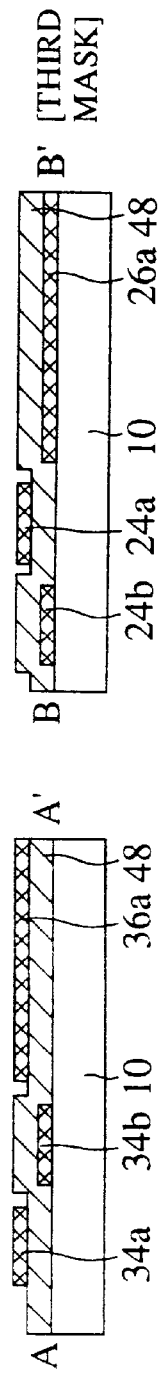
Figure 30:
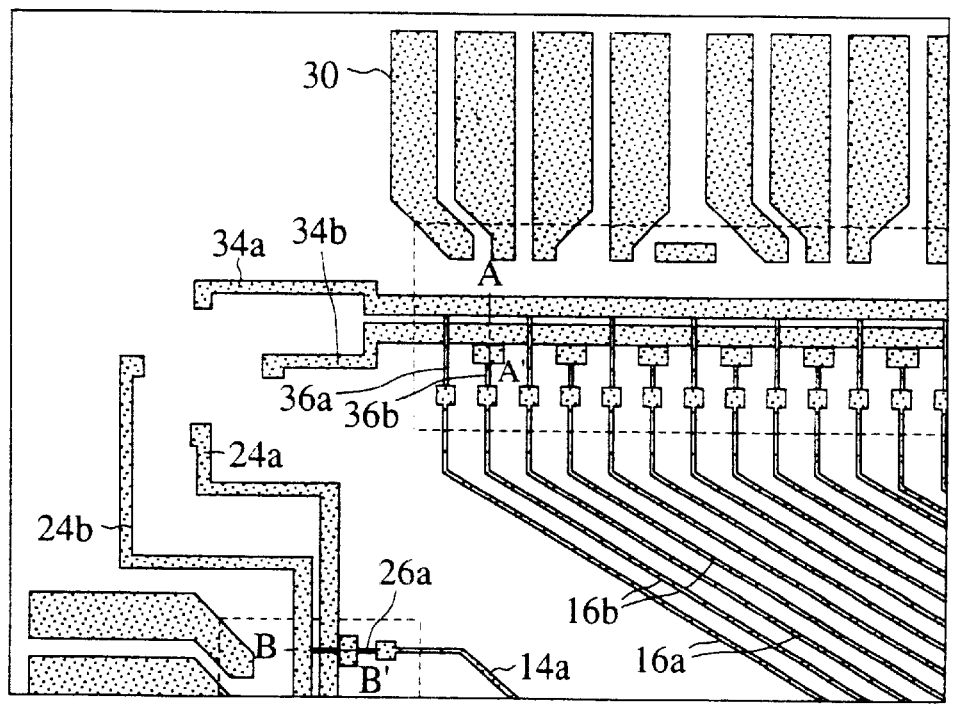
FIG. 30 is a plan view of the thin film transistor matrix device according to the fourth embodiment of the present invention at a step of the first method for fabricating the same (Part 2).

Next, by the use of a third mask, the metal layer 52 and the semiconductor active layer 56 are patterned to form source electrodes 40s, drain electrodes 40d, the drain bus lines 16a, 16b, the drain connection lines 34a, the thin connection lines 36a, 36b, input electrodes 30, and the gate connection line 24a (FIGS. 27D and 30).

Then, the second insulating film 54 of an SiN film, a two-layer film of an SiO 2 film and an SiN film or others is formed on the entire surface by plasma CVD (FIG. 28A).

Figure 31:
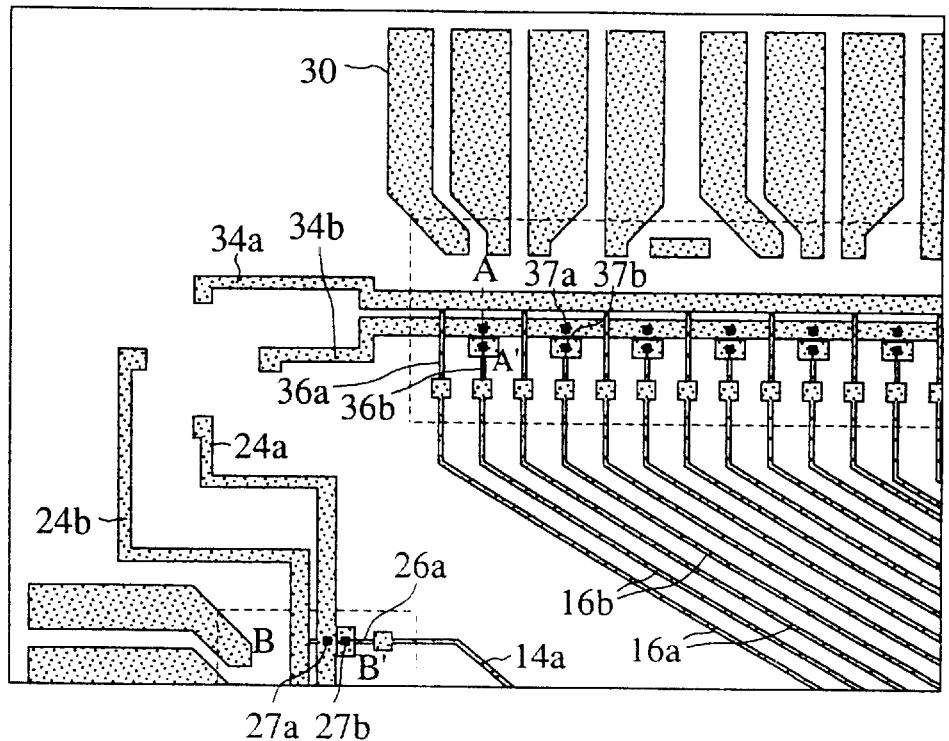
FIG. 31 is a plan view of the thin film transistor matrix device according to the fourth embodiment of the present invention at a step of the fourth method for fabricating the same (Part 3).

Next, the second and the first insulating films 54, 48 are patterned by the use of a fourth mask to form the contact holes 27a, 27b, the contact holes 37a, 37b and the contact holes for the resistant lines 38 (FIGS. 28B and 31).

Then, the transparent electrode film 56 is formed on the entire surface by sputtering (FIG. 28C).

Figure 32:
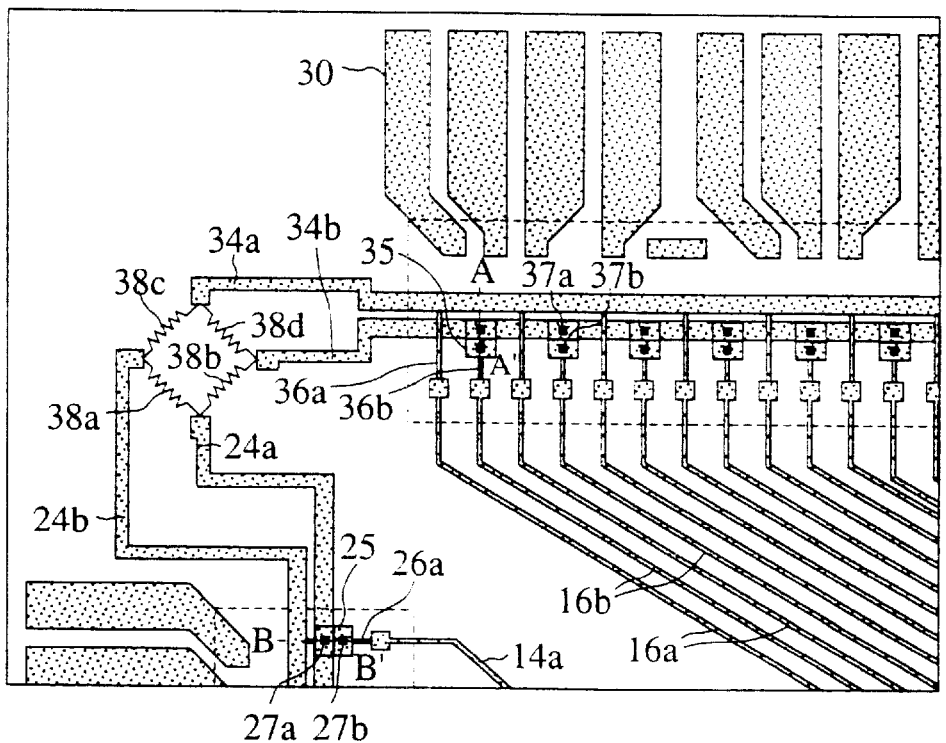
FIG. 32 is a plan view of the thin film transistor matrix device according to the fourth embodiment of the present invention at a step of the fourth method for fabricating the same (Part 4).

Then, the transparent electrode film 56 is patterned by the use of a fifth mask to form the connection line 35, picture element electrodes 42, the gate connection line 24a, the drain connection line 34b, the resistant lines 38a, 38b, 38b, 38d, and the connection line 25 (FIGS. 28D and 32). The resistant lines 38a, 38b, 38c, 38d are patterned so as to interconnect the ends of the gate connection lines 24a, 24b and the ends of the drain connection line s 34a, 34b.

Thus, by the use of only 5 masks, the thin film transistor matrix device according to the present embodiment can be fabricated a s the first embodiment.

As described above, according to the present embodiment, the gate bus lines 14a, 14b are commonly connected to the gate connection lines 24a, 24b, and the drain bus lines 16a, 16b are commonly connected to the drain connection lines 34a, 34b, whereby in the process for fabricating the thin film transistor matrix device and the process for forming a liquid crystal panel, even when electrostatic charges are applied, no local presence of charges, and electric stresses can be mitigated.

For higher inspection precision, a test in which different voltages are applied to adjacent gate bus lines and also to adjacent drain bus lines is preferred to a test in which the same voltage is applied to all the gate bus lines and to all the drain bus lines. According to the present embodiment, adjacent ones 14a, 14b of the gate bus lines 14 are respectively commonly connected, and adjacent ones 24a, 24b of the drain bus lines 24 are respectively commonly connected, whereby tests of high precision can be conducted even by applying different voltages to adjacent gate bus lines and also to adjacent drain bus lines.

5. A Fifth Embodiment

The thin film transistor matrix device according to a fifth embodiment of the present invention will be explained with reference to FIGS. 33 and 34.

Figure 33:
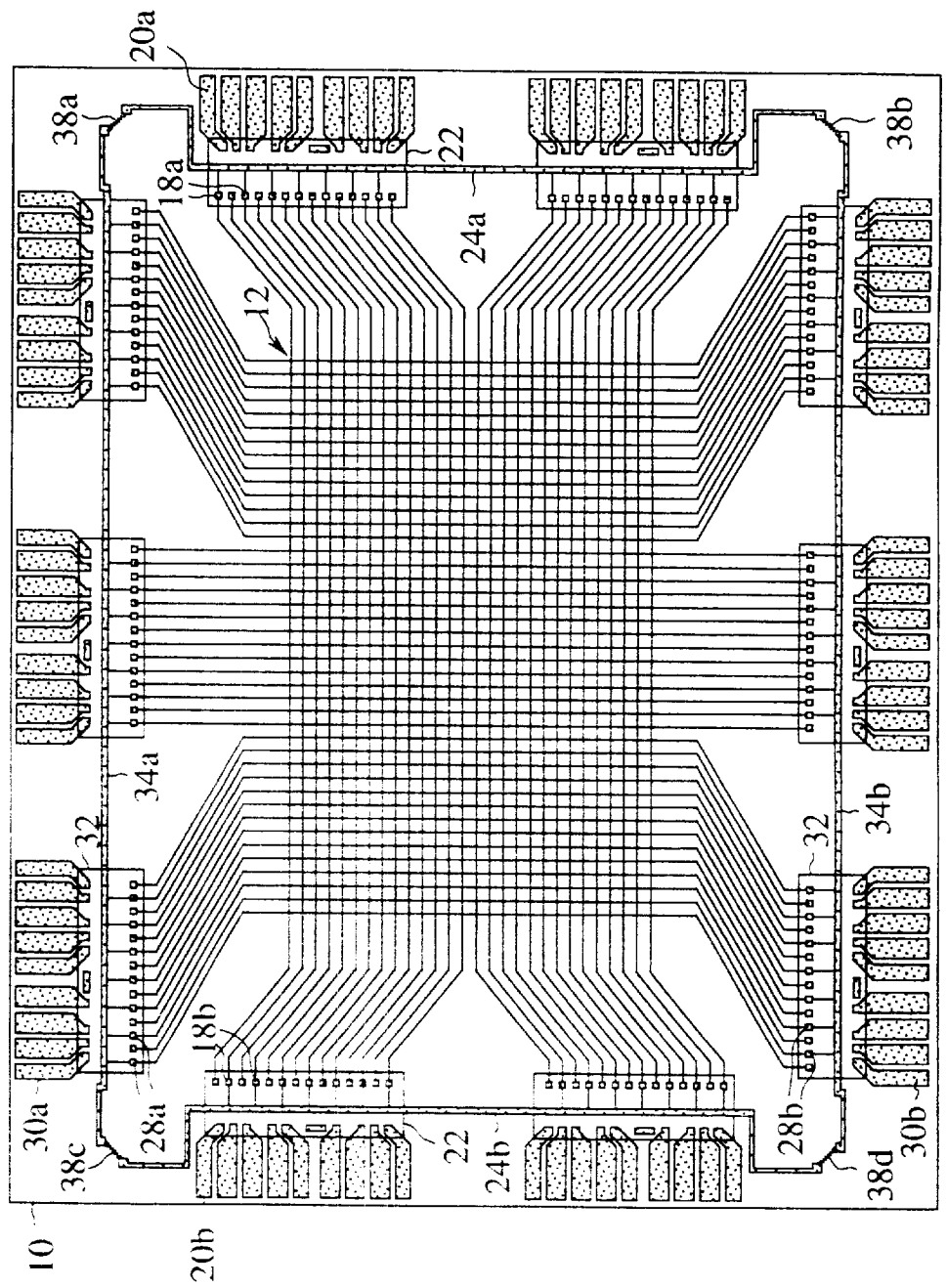
FIG. 33 is a plan view of the thin film transistor matrix device according to a fifth embodiment of the present invention.
Figure 34:
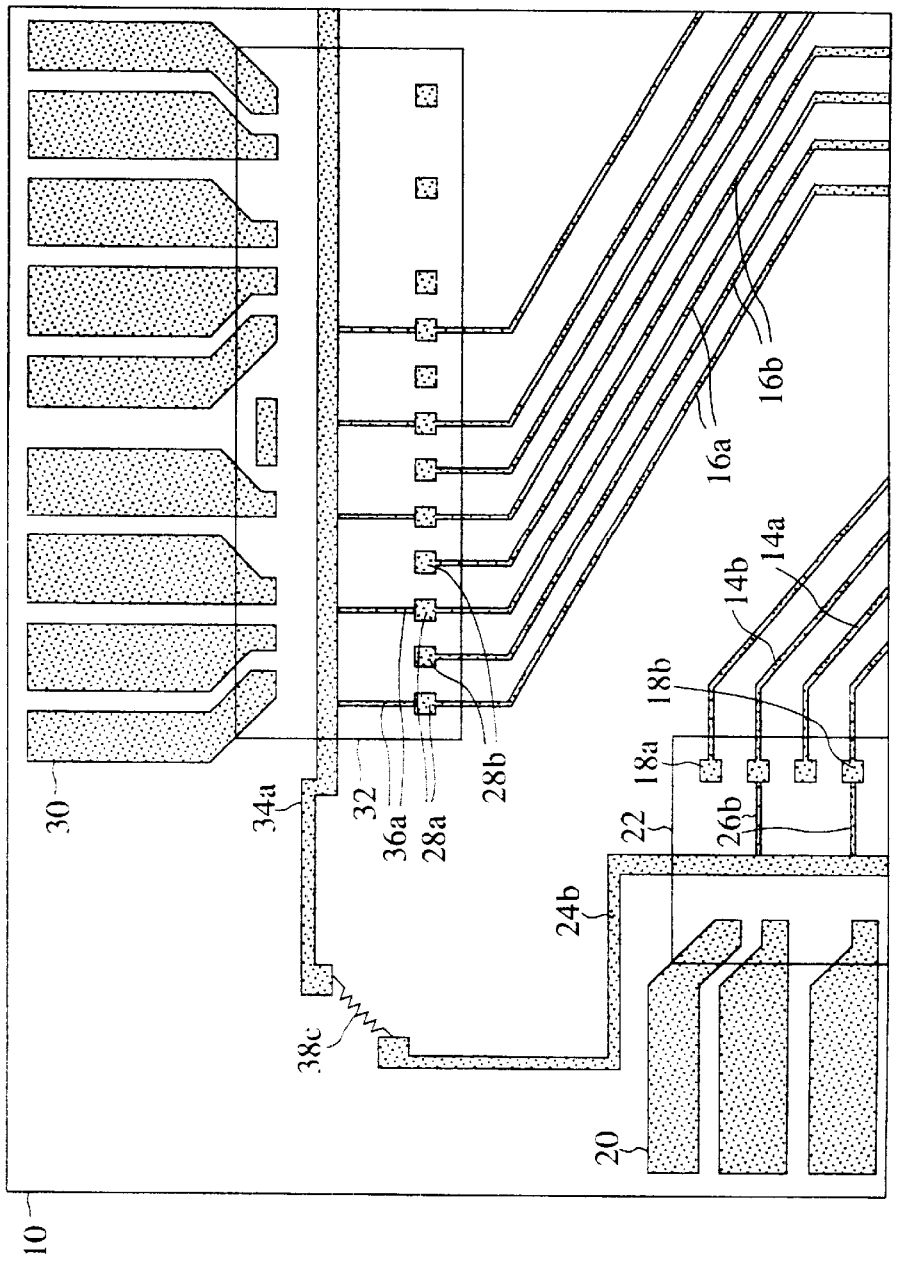
FIG. 34 is an enlarged plan view of the thin film matrix device of FIG. 33.
Figure 35:
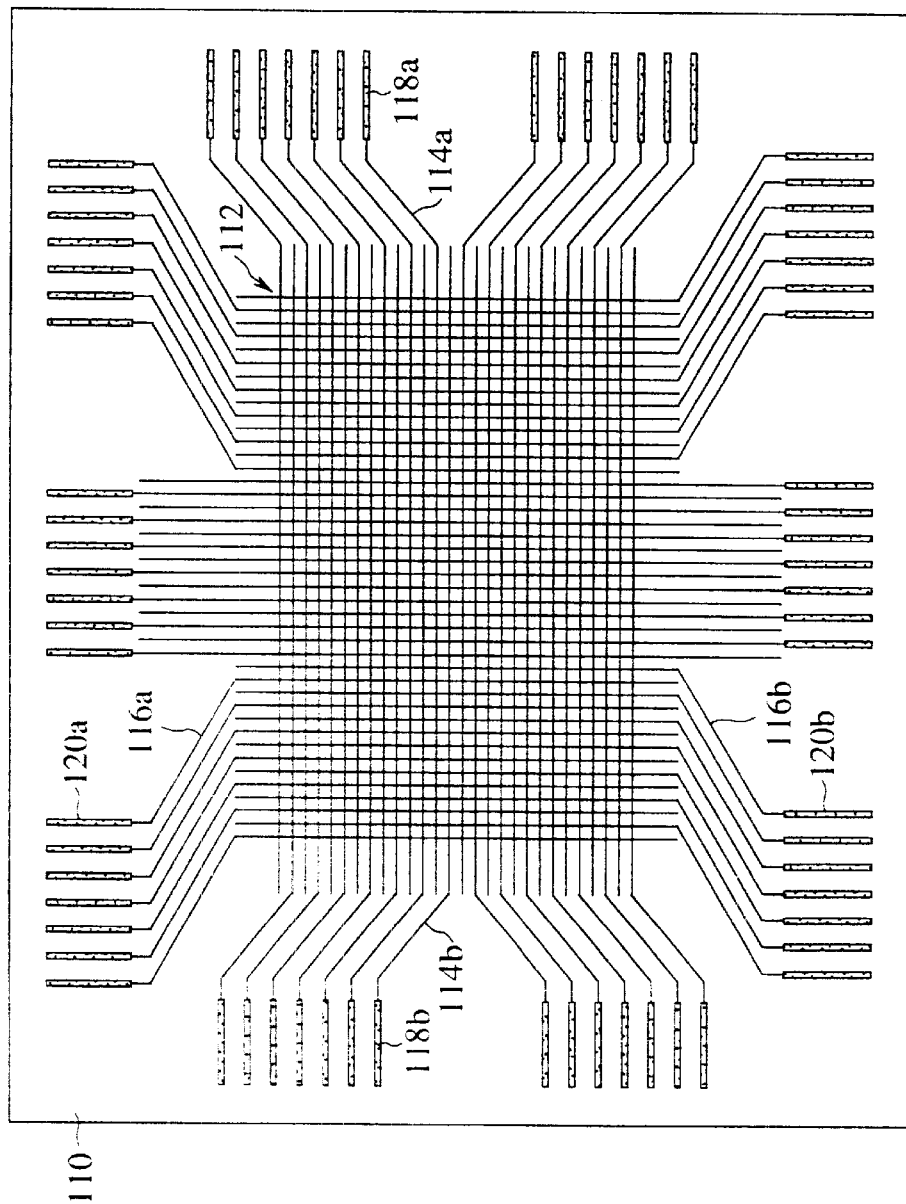
FIG. 35 is a plan view of a conventional thin film matrix device.

FIG. 33 is a view of a pattern layout of the thin film transistor matrix device according to the present embodiment. FIG. 34 is an enlarged view of the wiring region of the thin film transistor matrix device of FIG. 33. The same members or members of the same kinds of the present embodiment as the first to the fourth embodiments are represented by common reference numerals to simplify or not to repeat their explanation.

In the thin film transistor matrix device according to the present embodiment, gate connection lines 24a, 24b which respectively commonly connect gate bus lines 14a, 14b, and a drive circuit on the gate side are arranged on both sides of a transparent insulating substrate 10, and drain connection lines 34a, 34b which respectively commonly connect drain bus lines 16a, 16b, and a drive circuit for the drain side are arranged on both sides of the transparent insulating substrate 10.

A plurality of gate bus lines 14 are divided into odd number-th gate bus lines 14a and even number-th gate bus lines 14b.

Bumps 18a are formed on the ends of the odd number-th gate bus lines 14a on the right side as viewed in FIG. 33. Input terminals 20a for receiving signals from the outside are formed on the right margin of the transparent insulating substrate 10. The gate connection line 24a is extended longitudinally through an IC chip region 22 between the gate connection line 24a, and the input terminals 20a and the bumps 18a.

Bumps 18b are formed on the ends of the even number-th gate bus lines 14b on the left side as viewed in FIG. 33. Input terminals 20b for receiving signals from the outside are formed on the left margin of the transparent insulating substrate 10. The gate connection line 24b is extended longitudinally through a n IC chip region 22 between the input terminals 20b and the bumps 18b.

Bumps 28a are formed on the ends of the odd number-th drain bus lines 16a on the upper side as viewed in FIG. 33. Input terminals 30a for receiving signals from the outside are formed on the upper margin of the transparent insulating substrate 10. The gate connection line 34a is extended longitudinally through an IC chip region 32 between the input terminals 30a and the bumps 28a.

Bumps 28b are formed on the ends of the even number-th drain bus lines 16b on the lower end as viewed in FIG. 33. Input terminals 30b for receiving signals from the outside are formed on the lower margin of the transparent insulating substrate 10. The gate connection line 34b is extended longitudinally through an IC chip region between the input terminals 30b and the bumps 28b.

Resistant lines 38.a, 38b, 38c, 38d interconnect the gate connection lines 24a, 24b and the drain connection lines 34a, 34b. The resistant line 38a interconnects the gate connection line 24a and the drain connection line 34a; the resistant connection line 38b interconnects the gate connection line 24a and the drain connection line 34b; the resistant line 38c interconnect s the gate connection line 24b and th e drain connection line 34a; and the resistant line 38d interconnects the gate connection line 24b and the drain connection line 34b.

As described above, the gate bus lines 14a, 14b are respectively commonly connected to the gate connection lines 24a, 24b, and the drain bus lines 16a, 16b are respectively commonly connected to the drain connection lines 34a, 34b, whereby in the process for fabricating the thin film transistor matrix device and in the process for forming a liquid crystal panel, even when electrostatic charges are applied, there is no local presence of charges, and electric stresses can be mitigated. Furthermore, according to the present embodiment, the gate bus lines 14a, 14b which are adjacent to each other are respectively commonly connected to the gate connection lines, and the drain bus lines 24a, 24b which are adjacent to each other are respectively commonly connected to the drain connection lines, whereby different voltages are applied to the gate bus lines which are adjacent to each other and to the drain bus lines which are adjacent to each other, whereby inspection of high precision can be conducted.

6. Variations

The present invention is not limited to the above-described embodiments and includes other variations.

For example, in the above-described embodiments, the present invention is applied to inverse-staggered TFT matrix device but is also applicable to devices of other device structures, such as staggered TFT matrix devices.

In the above-described embodiments, the gate bus lines and the drain bus lines are respectively grouped as even-number-th ones and odd number-th ones to be connected to the respective connection lines by group, but the present invention is not limited to this connection mode. The gate bus lines and the drain bus lines may be grouped in other combinations to be commonly connected to the connection lines.

What is claimed is:

1. A method for fabricating a thin film transistor matrix device comprising:
   a first step of forming on a transparent insulating substrate:
      a plurality of gate bus lines for commonly connecting gates of thin film transistors, alternating ones of said plurality of gate bus lines being divided into either a group of odd numbered gate bus lines or a group of even numbered gate bus lines;
      a plurality of first outside terminals opposed to ends of the gate bus lines; and
      a first gate connection line for commonly connecting the gate bus lines of a selected one of the odd and the even numbered groups of gate bus lines;
   a second step of forming a first insulating film on the entire surface; and
   a third step of forming on the first insulating film
      a plurality of drain bus lines for commonly connecting drains of the thin film transistors, alternating ones of said plurality of drain bus lines being divided into either a group of odd numbered drain bus lines or a group of even numbered drain bus lines;
      a plurality of second outside terminals opposed to ends of the drain bus lines, and
      a first drain connection line for commonly connecting the drain bus lines of a selected one of the odd and the even numbered groups of drain bus lines;
   a fourth step of forming a second insulating film on the entire surface; and
   a fifth step of forming on the second insulating film:
      a plurality of picture element electrodes;
      a second gate connection line for commonly connecting the gate bus lines of a selected other of the odd and the even numbered groups of gate bus lines; and
      a second drain connection line for commonly connecting the drain bus lines of a selected other of the odd and the even numbered groups of drain bus lines.

2. A method for fabricating a thin film transistor matrix device according to claim 1, wherein
   in the fifth step, resistant lines for interconnecting the first and the second gate connection lines and the first and the second drain connection lines are formed.

3. A method for fabricating a thin film transistor matrix device comprising:
   a first step of forming on a transparent insulating substrate:
      a plurality of gate bus lines for commonly connecting gates of thin film transistors, alternating ones of said plurality of gate bus lines being divided into either a group of odd numbered gate bus lines or a group of even numbered gate bus lines;
      a plurality of first outside terminals opposed to ends of the gate bus lines;
      a first gate connection line for commonly connecting the gate bus lines of a selected one of the odd and the even numbered groups of gate bus lines; and
      a first drain connection line;
   a second step of forming a first insulating film on the entire surface; and
   a third step forming on the first insulating film
      a plurality of drain bus lines for commonly connecting drains of the thin film transistors, alternating ones of said plurality of drain bus lines being divided into either a group of odd numbered drain bus lines or a group of even numbered drain bus lines, said first drain connection line commonly connecting the drain bus lines of a selected one of the odd and the even numbered groups of drain bus lines;
      a plurality of second outside terminals opposed to ends of the drain bus lines; and
      a second drain connection line for commonly connecting the drain bus lines of a selected other of the odd and the even numbered groups of drain bus lines; and
      a second gate connection line for commonly connecting the gate bus lines of a selected other of the odd and the even numbered groups of gate bus lines.

4. A method for fabricating a thin film transistor matrix device according to claim 3, further comprising:
   a fourth step of forming a second insulating film on the entire surface after the third step; and
   a fifth step of forming on the second insulating film
      a plurality of film picture element electrodes, and
      a resistant line for interconnecting the gate connection lines and the drain connection lines.

* * * * *

UNITED STATES PATENT AND TRADEMARK OFFICE
CERTIFICATE OF CORRECTION

PATENT NO. : 6,406,946 B1  Page 1 of 1
DATED : June 18, 2002
INVENTOR(S) : Takizawa et al.

It is certified that error appears in the above-identified patent and that said Letters Patent is hereby corrected as shown below:

Title page,
Item [75], Inventors, please delete "Hidaki Takizawa" and insert -- Hideaki Takizawa --.

Signed and Sealed this

Sixth Day of January, 2004

JAMES E. ROGAN
*Director of the United States Patent and Trademark Office*